(12) United States Patent
Nowak et al.

(10) Patent No.: US 9,711,520 B2
(45) Date of Patent: Jul. 18, 2017

(54) THREE DIMENSIONAL SEMICONDUCTOR MEMORY DEVICES

(71) Applicant: Samsung Electronics Co., Ltd., Suwon-Si, Gyeonggi-do (KR)

(72) Inventors: Etienne Nowak, Suwon-si (KR); Xia Zhiliang, Hwaseong-si (KR); Daesin Kim, Hwaseong-si (KR); Young-Gu Kim, Osan-si (KR); Narae Jeong, Osan-si (KR)

(73) Assignee: Samsung Electronics Co., Ltd (KR)

( * ) Notice: Subject to any disclaimer, the term of this patent is extended or adjusted under 35 U.S.C. 154(b) by 64 days.

(21) Appl. No.: 14/735,811

(22) Filed: Jun. 10, 2015

(65) Prior Publication Data

US 2016/0005753 A1     Jan. 7, 2016

(30) Foreign Application Priority Data

Jul. 2, 2014  (KR) ........................ 10-2014-0082551

(51) Int. Cl.
| | |
|---|---|
| *H01L 27/115* | (2017.01) |
| *H01L 27/11573* | (2017.01) |
| *H01L 27/11578* | (2017.01) |
| *G11C 16/04* | (2006.01) |
| *H01L 29/423* | (2006.01) |
| *H01L 27/11565* | (2017.01) |
| *H01L 27/11582* | (2017.01) |
| *G11C 8/14* | (2006.01) |

(52) U.S. Cl.
CPC .......... *H01L 27/11573* (2013.01); *G11C 8/14* (2013.01); *G11C 16/04* (2013.01); *H01L 27/11565* (2013.01); *H01L 27/11578* (2013.01); *H01L 27/11582* (2013.01); *H01L 29/42344* (2013.01)

(58) Field of Classification Search
CPC ......... H01L 27/11511; H01L 27/11578; H01L 27/11526; H01L 27/11573; H01L 29/42344; G11C 16/04
See application file for complete search history.

(56) References Cited

U.S. PATENT DOCUMENTS

| | | |
|---|---|---|
| 7,099,200 B2 | 8/2006 | Sakui |
| 7,388,783 B2 | 6/2008 | Sakui |
| 7,927,953 B2 | 4/2011 | Ozawa |
| 7,927,967 B2 | 4/2011 | Nomura et al. |
| 7,936,004 B2 | 5/2011 | Kito et al. |

(Continued)

FOREIGN PATENT DOCUMENTS

| | | |
|---|---|---|
| JP | 2002368140 A | 12/2002 |
| JP | 2010140997 A | 6/2010 |

(Continued)

*Primary Examiner* — Victoria K Hall
(74) *Attorney, Agent, or Firm* — Ward and Smith, P.A.

(57) ABSTRACT

A semiconductor memory device includes a semiconductor substrate including a common source region and a drain region, a lower structure provided on the semiconductor substrate and including a plurality of lower transistors connected in series between the common source region and the drain region, a stack including a plurality of word lines stacked on the lower structure, and semiconductor pillars penetrating the stack and controlling gate electrodes of respective ones of the lower transistors.

20 Claims, 24 Drawing Sheets

(56) References Cited

U.S. PATENT DOCUMENTS

| | | | |
|---|---|---|---|
| 8,163,617 B2 | 4/2012 | Ahn | |
| 8,178,919 B2 | 5/2012 | Fujiwara et al. | |
| 8,187,936 B2 | 5/2012 | Alsmeier et al. | |
| 8,283,228 B2 | 10/2012 | Alsmeier | |
| 8,324,677 B2 | 12/2012 | Lee et al. | |
| 8,334,561 B2 | 12/2012 | Fukuzumi et al. | |
| 8,445,347 B2 | 5/2013 | Alsmeier | |
| 8,497,555 B2 | 7/2013 | Kim et al. | |
| 9,001,590 B2* | 4/2015 | Lue | G11C 16/04 365/185.18 |
| 9,082,656 B2* | 7/2015 | Chen | H01L 27/1157 |
| 9,214,236 B2* | 12/2015 | Lue | H01L 21/28273 |
| 9,230,985 B1* | 1/2016 | Wu | H01L 27/11582 |
| 9,443,861 B1* | 9/2016 | Pachamuthu | H01L 27/11524 |
| 2008/0180994 A1* | 7/2008 | Katsumata | G11C 7/18 365/174 |
| 2008/0186771 A1* | 8/2008 | Katsumata | G11C 16/0483 365/185.17 |
| 2009/0278195 A1* | 11/2009 | Toba | H01L 21/28282 257/326 |
| 2011/0199825 A1* | 8/2011 | Han | G11C 16/10 365/185.11 |
| 2011/0199829 A1* | 8/2011 | Lee | G11C 16/0483 365/185.17 |
| 2011/0216603 A1* | 9/2011 | Han | G11C 16/04 365/185.23 |
| 2011/0305088 A1* | 12/2011 | Huang | G11C 11/5628 365/185.15 |
| 2011/0310670 A1* | 12/2011 | Shim | G11C 16/0408 365/185.17 |
| 2012/0001345 A1* | 1/2012 | Park | H01L 27/11551 257/774 |
| 2012/0051138 A1* | 3/2012 | Kim | G11C 16/0483 365/185.17 |
| 2012/0208347 A1* | 8/2012 | Hwang | H01L 27/1157 438/430 |
| 2012/0300561 A1* | 11/2012 | Yun | G11C 5/025 365/189.09 |
| 2012/0327719 A1* | 12/2012 | Lue | G11C 16/0483 365/185.23 |
| 2013/0007353 A1* | 1/2013 | Shim | G11C 16/10 711/103 |
| 2013/0009236 A1* | 1/2013 | Lee | H01L 27/11556 257/329 |
| 2013/0170297 A1* | 7/2013 | Nam | G11C 16/0483 365/185.09 |
| 2013/0188423 A1* | 7/2013 | Nam | G11C 16/04 365/185.17 |
| 2013/0262751 A1* | 10/2013 | Kwak | G11C 16/3495 711/103 |
| 2013/0264626 A1 | 10/2013 | Sawa | |
| 2014/0110795 A1* | 4/2014 | Oh | H01L 27/11573 257/401 |
| 2014/0136765 A1* | 5/2014 | Oh | G11C 16/0483 711/103 |
| 2014/0252454 A1* | 9/2014 | Rabkin | H01L 27/249 257/329 |
| 2015/0055413 A1* | 2/2015 | Alsmeier | G11C 14/0018 365/185.08 |
| 2016/0078946 A1* | 3/2016 | Byun | G11C 16/10 365/185.12 |
| 2016/0111517 A1* | 4/2016 | Wu | H01L 29/66666 438/154 |
| 2016/0126251 A1* | 5/2016 | Fujita | H01L 27/11582 257/324 |

FOREIGN PATENT DOCUMENTS

| | | |
|---|---|---|
| JP | 2010199312 A | 9/2010 |
| JP | 2013219239 A | 10/2013 |

\* cited by examiner

FIG. 12

|  | SEL | UNSEL |
|---|---|---|
| BL | Vss | Vcc |
| SSL | Vcc | Vss/Float |
| WL | $V_{PGM}$ | $V_{PASS}$ |
| CSL | Float | – |
| BBL | Float | Float |
| ESL | Float | Float |

FIG. 14

|     | SEL   | UNSEL |
|-----|-------|-------|
| BL  | Float | Float |
| SSL | Float | Float |
| WL  | Vss   | Vss   |
| CSL | Float | -     |
| BBL | Float | Float |
| ESL | $V_{ERS}$ | -  |

FIG. 16

|  | SEL | UNSEL |
|---|---|---|
| BL | Vss | Vss |
| SSL | Vcc | Vss/Float |
| WL | $V_{read}$ | $V_{PASS}$ |
| CSL | Vss | – |
| BBL | $V_{BBL}$ | Vss |
| ESL | Float | Float |

FIG. 19

|      | SEL    | UNSEL     |
|------|--------|-----------|
| BL   | $V_{BL}$ | Vss     |
| SSL  | Vcc    | Vss/Float |
| WL   | $V_{read}$ | $V_{PASS}$ |
| CSL  | Vss    | –         |
| BBL  | $V_{BBL}$ | Vss    |
| ESL  | Float  | Float     |

THREE DIMENSIONAL SEMICONDUCTOR MEMORY DEVICES

CROSS-REFERENCE TO RELATED APPLICATIONS AND CLAIM OF PRIORITY

This U.S. non-provisional patent application claims priority under 35 U.S.C. §119 to Korean Patent Application No. 10-2014-0082551, filed on Jul. 2, 2014, in the Korean Intellectual Property Office, the entire disclosure of which is incorporated herein by reference.

BACKGROUND

Example embodiments of the inventive concepts relate to semiconductor memory devices, and in particular, to three-dimensional semiconductor memory devices with improved operation characteristics.

In order to satisfy consumer demands for superior performance and inexpensive prices of semiconductor devices, it is desirable to increase the integration level of semiconductor memory devices. The integration level of two-dimensional or planar semiconductor memory devices is primarily determined by the area occupied by a unit memory cell. The integration of two-dimensional semiconductor memory devices is therefore greatly influenced by the level of a fine pattern forming technology. However, the extremely expensive process equipment needed to reduce pattern sizes sets a practical limit on increasing integration for two-dimensional or planar semiconductor devices.

To address this limitation, three-dimensional semiconductor memory devices having three-dimensionally arranged memory cells have recently been proposed. However, the production of three dimensional semiconductor devices is more complicated and costly compared to two-dimensional semiconductor memory devices. In order to make three-dimensional semiconductor memory devices suitable for mass-production, the process technology for manufacturing three dimensional semiconductor devices should provide a lower manufacturing cost per bit than two-dimensional semiconductor memory devices while maintaining or exceeding the level of reliability of two-dimensional semiconductor memory devices.

SUMMARY

Example embodiments of the inventive concept provide a three-dimensional semiconductor memory device with improved operation characteristics.

According to some embodiments of the inventive concepts, a three-dimensional semiconductor memory device may include a semiconductor substrate including a common source region and a drain region, a lower structure provided on the semiconductor substrate and including a plurality of lower transistors connected in series between the common source region and the drain region, a stack including a plurality of word lines stacked on the lower structure, and semiconductor pillars penetrating the stack and controlling gate electrodes of the lower transistors, respectively.

In some embodiments, the lower structure may include a plurality of lower gate electrodes, which are disposed spaced apart from each other on the semiconductor substrate, and impurity regions, which are formed in the semiconductor substrate between respective pairs of the lower gate electrodes.

In some embodiments, the semiconductor pillars may be in direct contact with the lower gate electrodes, respectively.

In some embodiments, the semiconductor substrate may further include a plurality of impurity regions arranged between the common source region and the drain region along one direction. The semiconductor pillars may form the gate electrodes of the lower selection transistors controlling electric connections between the impurity regions adjacent to each other.

In some embodiments, the semiconductor pillars may be arranged in first and second directions perpendicular to each other, when viewed in a plan view. The device may further include bit lines, each of which connects the semiconductor pillars arranged along the first direction, string selection lines provided on the stack to cross the semiconductor pillars arranged along the second direction and face sidewalls of the semiconductor pillars, and a vertical insulating layer provided between the stack and the semiconductor pillars and between the string selection lines and the semiconductor pillars.

In some embodiments, the device may further include string erase lines, which are provided on the stack to extend parallel to the string selection lines and be in contact with portions of the semiconductor pillars.

In some embodiments, a width of each of the semiconductor pillars may be smaller near the string erase lines than near the word lines.

According to some embodiments of the inventive concepts, a three-dimensional semiconductor memory device may include a lower string connecting a common source line to a first bit line, the lower string including a plurality of lower transistors connected in series to each other, and a plurality of cell strings, each of which includes a plurality of memory cells connected in series between the lower string and a second bit line and controls a gate electrode of a corresponding one of the lower transistors.

In some embodiments, each of the cell strings may further include a string selection transistor connecting the second bit line to a memory cell adjacent thereto in series.

In some embodiments, each of the cell strings may include a plurality of word lines vertically stacked on a semiconductor substrate, a semiconductor pillar penetrating the word lines, and a vertical insulating layer disposed between the word lines and the semiconductor pillar.

In some embodiments, the device may further include a string erase line in contact with portions of the semiconductor pillars.

In some embodiments, a width of each of the semiconductor pillars may be smaller near the string erase line than near the word lines.

In some embodiments, the device may further include a read and write circuit electrically connected to the first and second bit lines.

In some embodiments, the lower string may include a plurality of lower gate electrodes, which are disposed spaced apart from each other on a semiconductor substrate, and impurity regions, which are formed in the semiconductor substrate and between the lower gate electrodes.

In some embodiments, the lower string may further include a common source region formed in a semiconductor substrate and electrically connected to the common source line, a drain region formed in the semiconductor substrate and electrically connected to the first bit line, a plurality of impurity regions formed in the semiconductor substrate and arranged between the common source region and the drain region along one direction, and semiconductor pillars controlling electric connections between the impurity regions adjacent to each other.

According to some embodiments of the inventive concepts, a three-dimensional semiconductor memory device may include a semiconductor substrate, which includes an active portion extending along a first direction and a plurality of impurity regions disposed spaced apart from each other in the active portion, a stack including a plurality of word lines stacked on the semiconductor substrate, semiconductor pillars penetrating the stack and controlling electric connections between the impurity regions disposed adjacent to each other, a common source line electrically connected to one end of the active portion, and a first bit line electrically connected to an opposite end of the active portion.

In some embodiments, the semiconductor pillars may be arranged along first and second directions perpendicular to each other. The device may further include second bit lines connected to the semiconductor pillars arranged along the first direction and string selection lines provided on the stack to cross sidewalls of the semiconductor pillars arranged along the second direction.

In some embodiments, the device may further include lower gate electrodes, which are provided between the semiconductor substrate and the stack, when viewed in a vertical view, and are provided between the impurity regions adjacent to each other, when viewed in a plan view.

In some embodiments, the semiconductor pillars may be in direct contact with the lower gate electrodes.

In some embodiments, the device may further include a string erase line provided on the stack to be in contact with portions of the semiconductor pillars.

According to some embodiments of the inventive concepts, a three-dimensional semiconductor memory device may include a semiconductor substrate, a lower string including a common source region, a drain region and a plurality of lower transistors connected in series between the common source region and the drain region, and a plurality of cell strings provided on respective ones of the lower transistors. Each of the plurality of cell strings may include a plurality of memory cells connected in series between the respective one of the lower transistors and a bit line, and each of the plurality of cell strings may control a gate electrode of a corresponding one of the lower transistors.

BRIEF DESCRIPTION OF THE DRAWINGS

Example embodiments will be more clearly understood from the following brief description taken in conjunction with the accompanying drawings. The accompanying drawings represent non-limiting embodiments as described herein.

FIG. 12 is a table showing an example of a voltage condition for a program operation of a three-dimensional semiconductor memory device according to some embodiments of the inventive concepts.

FIG. 14 is a table showing an example of a voltage condition for an erase operation of a three-dimensional semiconductor memory device according to some embodiments of the inventive concepts.

FIG. 16 is a table showing an example of a voltage condition for a read operation of a three-dimensional semiconductor memory device according to some embodiments of the inventive concepts.

FIG. 19 is a table showing another example of a voltage condition for a read operation of a three-dimensional semiconductor memory device according to some embodiments of the inventive concepts.

Figure 1:
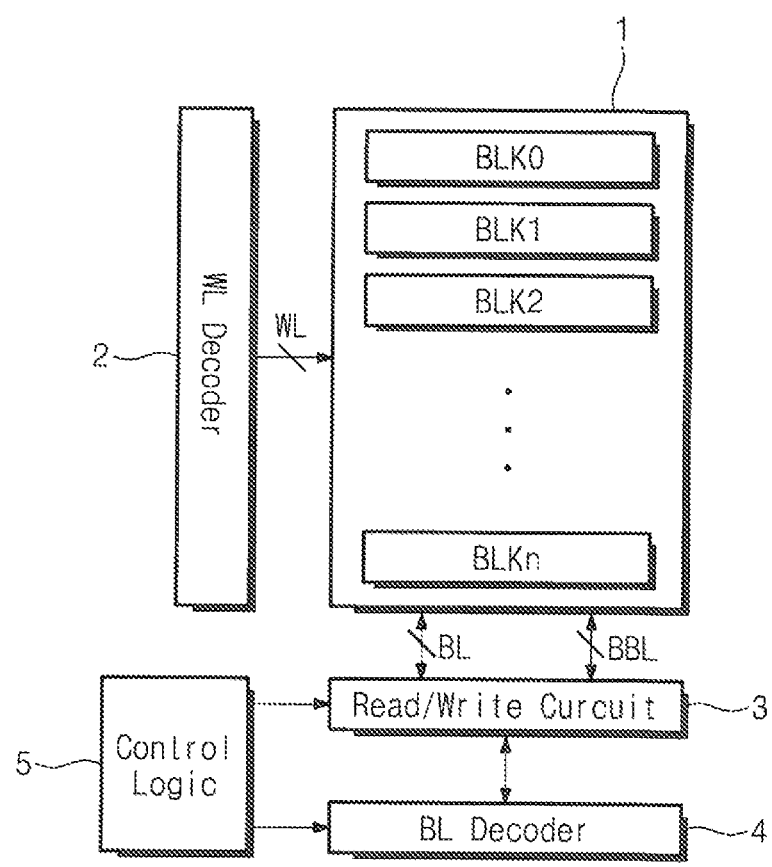
FIG. 1 is a block diagram illustrating a three-dimensional semiconductor memory device according to some embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

FIG. 1 is a block diagram illustrating a three-dimensional semiconductor memory device according to example embodiments of the inventive concepts.

Referring to FIG. 1, a three-dimensional semiconductor memory device according to some embodiments includes a memory cell array 1, a word line decoder 2, a read and write circuit 3, a bit line decoder 4, and a control logic 5.

The memory cell array 1 may include a plurality of memory blocks BLK0-BLKn, each of which is configured to be independently erased. Each of the memory blocks BLK0-BLKn may include a plurality of memory cells and a plurality of word and bit lines WL, BL, BBL electrically connected to the memory cells. The memory cell array 1 will be described in more detail with reference to FIG. 2.

The word line decoder 2 may decode an address signal that is input from an external system, and responsively select one of the word lines WL. The word line decoder 2 may be connected in common to the plurality of memory blocks BLK0-BLKn and may provide a driving signal to the word lines WL of one of the memory blocks BLK0-BLKn that is selected in response to a block selection signal. The word line decoder 2 may be configured to provide word line voltages, which may be generated in a voltage generator, to a selected word line and unselected word lines, in response to control signals from a control circuit.

Depending on an operation mode, the read and write circuit 3 may temporarily store data to be stored in the memory cells or read out data stored in the memory cells. For example, the read and write circuit 3 may function as a write driver in a program operation mode or as a sense amplifier in a read operation mode. In certain embodiments, the read and write circuit 3 may be configured to provide an electric signal (e.g., voltage or current) input from the control logic 5 to at least one of the bit lines BL.

In example embodiments, first bit lines BBL may be used to read data from the memory cell array 1 to the read and write circuit 3, and second bit lines BL may be used to write from the read and write circuit 3 to the memory cell array 1.

The bit line decoder 4 may decode the address signal input from the external system to select one of the bit lines BL. The bit line decoder 4 may be connected in common to the plurality of memory blocks BLK0-BLKn and may provide data to the bit lines BL of one of the memory blocks BLK0-BLKn, which is selected in response to a block selection signal. The bit line decoder 4 may be configured to provide a data transmission path between the read and write circuit 3 and an external device (e.g., a memory controller).

Figure 2:
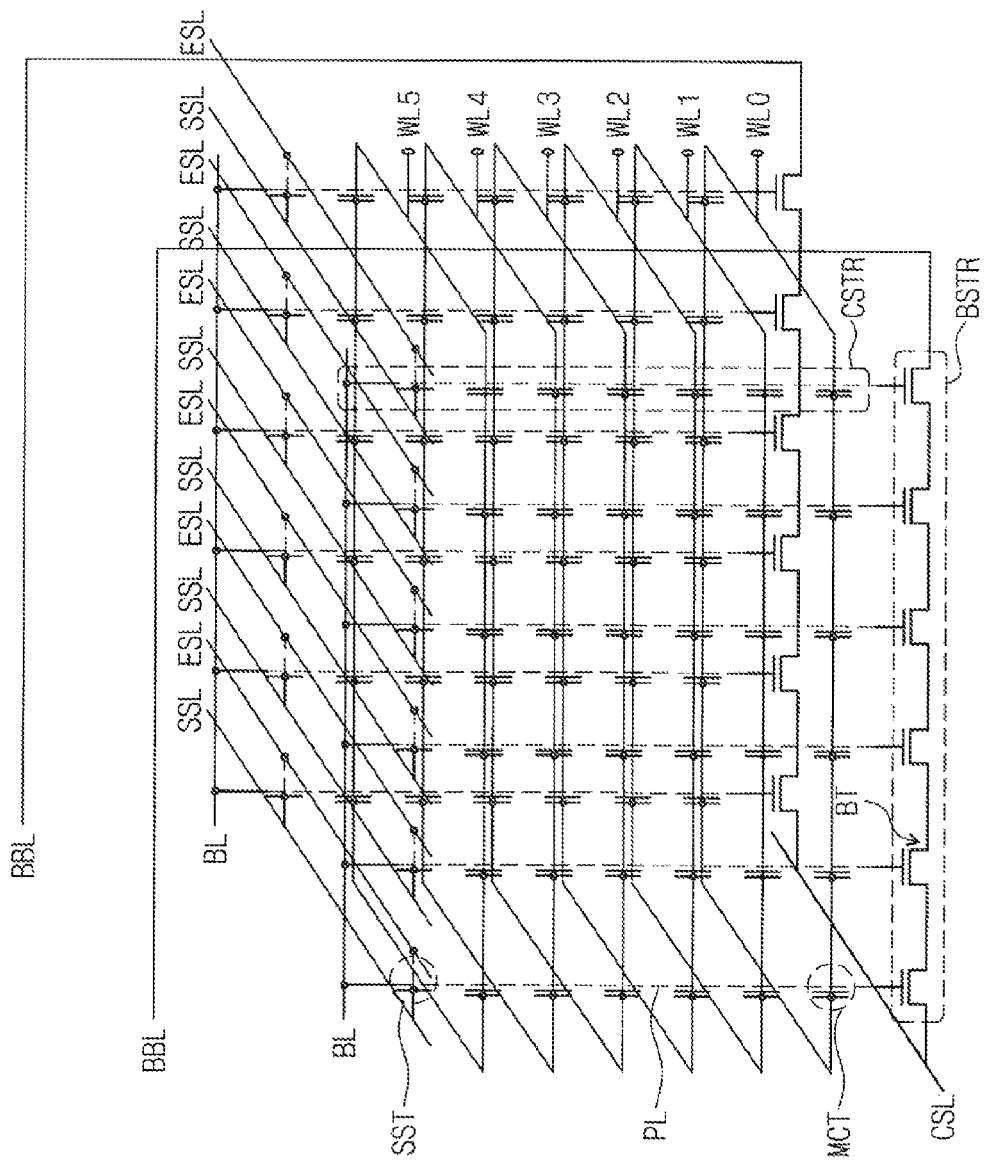
FIG. 2 is a schematic circuit diagram illustrating a three-dimensional semiconductor memory device according to example embodiments of the inventive concept.

FIG. 2 is a schematic circuit diagram illustrating a three-dimensional semiconductor memory device according to some embodiments of the inventive concepts.

Referring to FIG. 2, a cell array of a three-dimensional semiconductor memory device may include a plurality of first bit lines BBL, a plurality of second bit lines BL, a common source line CSL, a plurality of lower strings BSTR, and a plurality of cell strings CSTR.

The first bit lines BBL may be connected to the lower strings BSTR, respectively, and the common source line CSL may be connected in common to the plurality of lower strings BSTR. In other words, each of the lower strings BSTR may be connected between a corresponding one of the first bit lines BBL and the common source line CSL. Each of the lower strings BSTR may include a plurality of lower transistors BT connected in series between the first bit line BBL and the common source line CSL.

The second bit lines BL may be two-dimensionally arranged in the cell array, and the plurality of cell strings CSTR may be connected in parallel between each of the second bit lines BL and each of the lower strings BSTR.

Each of the cell strings CSTR may include a string selection transistor SST connected to the second bit line BL and a plurality of memory cell transistors MCT connected in series between the string selection transistor SST and the lower string BSTR.

In detail, the cell strings CSTR may include a plurality of word lines WL and a plurality of semiconductor pillars PL. The memory cell transistors MCT may be respectively formed at three-dimensional intersections of the word lines WL and the semiconductor pillars PL. Each of the memory cell transistors MCT may include a data storing element provided between the word line WL and the semiconductor pillar PL. In other words, each memory cell transistor MCT may include one of the semiconductor pillars PL, one of the word lines WL, and the data storing element therebetween. Each semiconductor pillar PL may be used to realize a plurality of the memory cell transistors MCT, which are connected in series to form each of the cell strings CSTR. The word lines WL may be used as gate electrodes of the memory cell transistors MCT, and each of the semiconductor pillars PL may be used as a common channel for memory cell transistors MCT. In a three-dimensional semiconductor memory device according to the present embodiment, the cell strings CSTR may be configured to provide a NAND-type FLASH memory device. It will be appreciated, however, that other types of configurations can be implemented.

To connect the memory cell transistors MCT in series, the word lines WL and the semiconductor pillars PL may be provided to realize metal-oxide-semiconductor (MOS) capacitors. Further, the memory cell transistors MCT may have a threshold voltage that is higher than that of the lower transistors BT.

An end portion of the semiconductor pillar PL may be connected to a corresponding one of the lower transistors BT, and an opposite end portion of the semiconductor pillar PL may be connected to a corresponding one of the second bit lines BL. The number of the semiconductor pillars PL connected to each second bit line BL may be at least two, and the number of the second bit line BL connected to each semiconductor pillar PL may be one.

String selection lines SSL may be provided between the second bit lines BL and the word line WL adjacent thereto. The string selection lines SSL enable selection of a corresponding one of the cell strings CSTR when the three-dimensional semiconductor memory device is operated. Each of the string selection lines SSL may be used as a gate electrode of the string selection transistor SST controlling electric connection between the semiconductor pillar PL and the second bit line BL. Accordingly, each of the semiconductor pillars PL may be independently selected by a corresponding one of the second bit lines BL and a corresponding one of the string selection lines SSL. The string selection line SSL and the semiconductor pillar PL may be disposed to form a MOS capacitor, thereby controlling the electric connection between the semiconductor pillar PL and the second bit line BL.

In the cell strings CSTR, electric potentials of the semiconductor pillars PL may be controlled by adjusting voltages applied to the word lines WL and the string selection line SSL. This makes it possible to control electric connection between the second bit lines BL and the gate electrodes of the lower transistors BT. In other words, the lower transistors BT may be controlled by controlling the electric potentials of the semiconductor pillars PL.

In addition, the three-dimensional semiconductor memory device may include string erase lines ESL directly connected to the semiconductor pillars PL. The string erase lines ESL may be provided between the second bit lines BL and the word line WL adjacent thereto, and each of them may be connected to a plurality of the semiconductor pillars PL. The string erase lines ESL may be used to supply holes directly to the semiconductor pillars PL connected thereto, in an erase operation.

Figure 3:
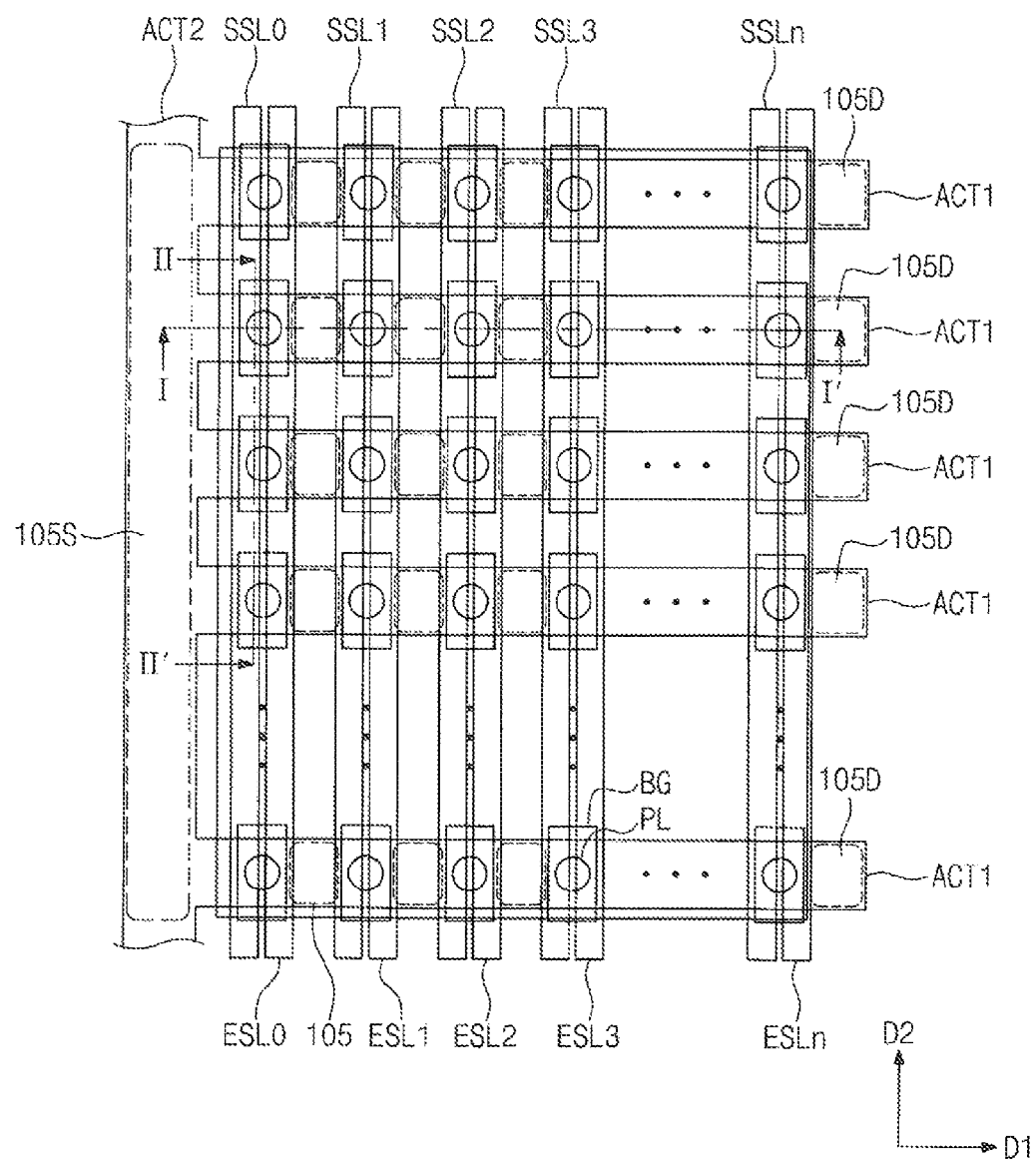
FIG. 3 is a plan view illustrating a three-dimensional semiconductor memory device according to some embodiments of the inventive concepts.
Figure 4:
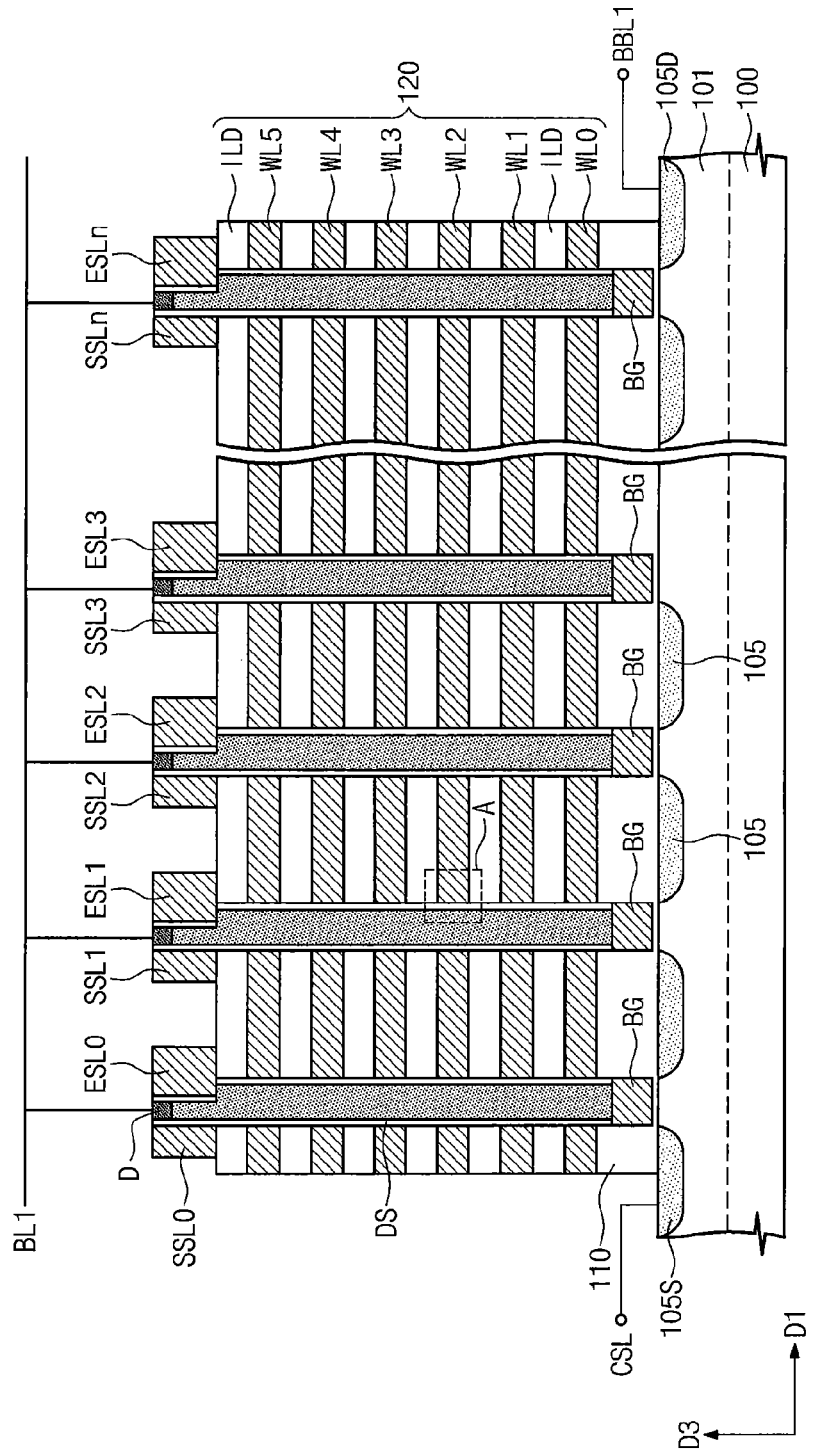
FIGS. 4 and 5 are sectional views taken along lines I-I' and II-II', respectively, of FIG. 3 to schematically illustrate a three-dimensional semiconductor memory device according to some embodiments of the inventive concepts.
Figure 5:
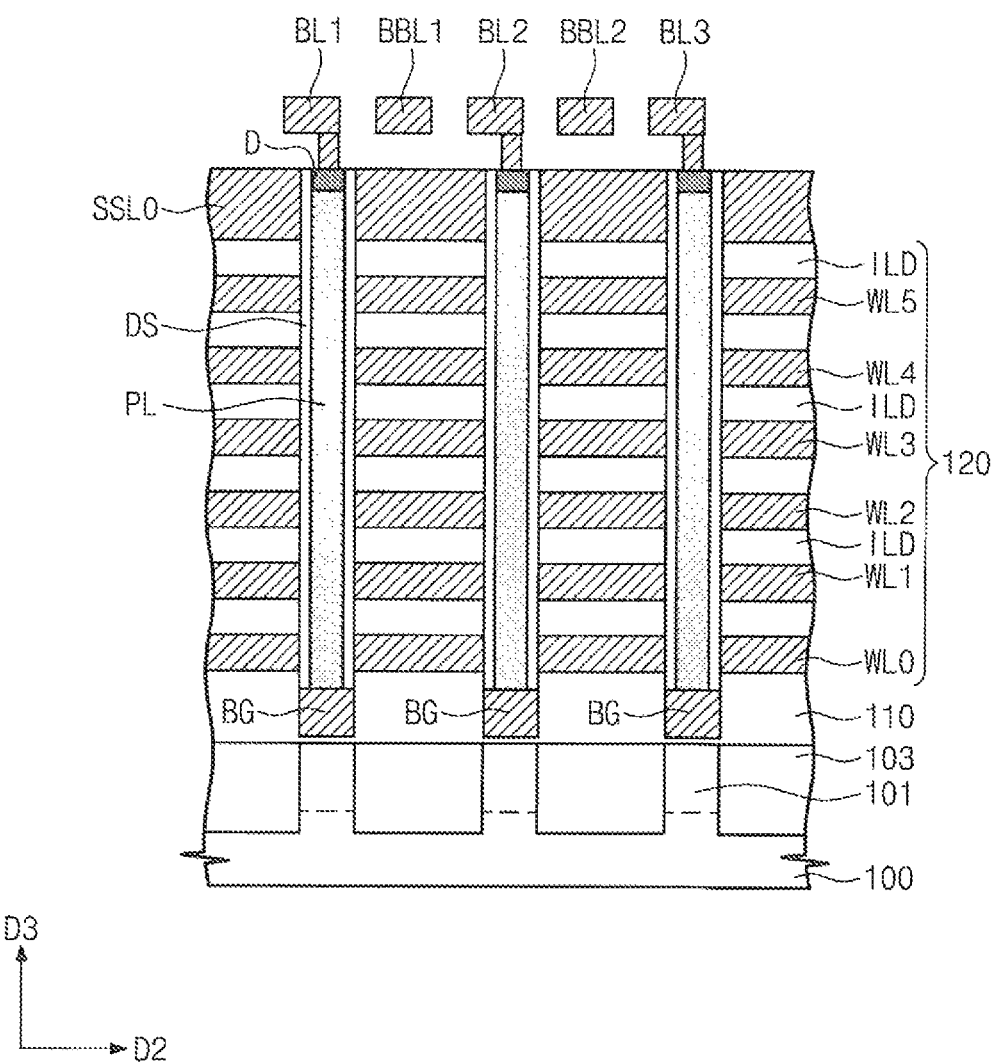

FIG. 3 is a plan view illustrating a three-dimensional semiconductor memory device according to some embodiments of the inventive concepts. FIGS. 4 and 5 are sectional views taken along lines I-I' and II-II', respectively, of FIG. 3 to schematically illustrate a three-dimensional semiconductor memory device according to embodiments of the inventive concepts.

Referring to FIGS. 3, 4, and 5, a semiconductor substrate 100 may include a plurality of active portions ACT1 and a common active portion ACT2, which are defined by a device isolation layer 103.

The semiconductor substrate 100 may, for example, be a silicon wafer, a silicon-germanium wafer, a germanium wafer, or a single crystalline epitaxial layer grown on a single crystalline silicon wafer. In example embodiments, the semiconductor substrate 100 may include a well impurity layer 101 of a first conductivity type. The well impurity layer 101 may be formed by doping the semiconductor substrate 100 with impurities of the first conductivity type. The well impurity layer 101 may be formed in the active portions ACT1 and the common active portion ACT2.

In the illustrated embodiments, the active portions ACT1 may extend parallel to a first direction D1 and may be spaced apart from each other in a second direction D2. The common active portion ACT2 may extend parallel to the second direction D2 or perpendicular to the first direction D1 and the active portions ACT1 may be connected in common to the common active portion ACT2. In other example embodiments, the common active portion ACT2 may be omitted. Furthermore, in other embodiments the first direction D1 and second direction D2 need not be perpendicular.

In some embodiments, a drain region 105D of a second conductivity type may be formed in an end portion of each of the active portions ACT1, and a common source region 105S of the second conductivity type may be formed in the common active portion ACT2. The common source region 105S may extend parallel to the second direction D2. First bit lines BBL1 may be connected to the drain regions 105D, respectively, and the common source line CSL may be connected to the common source region 105SS. Further, impurity regions 105 of the second conductivity type may be formed in the active portions ACT1, respectively. The impurity regions 105 may be arranged in the first and second directions D1 and D2, and the impurity regions 105 adjacent to each other in the second direction D2 may be separated from each other by the device isolation layer 103 interposed therebetween. The common source region 105SS, the drain region 105D, and the impurity regions 105 may be formed by doping the well impurity layer 101 with impurities of the second conductivity type. Further, the common source region 105S, the drain region 105D, and the impurity regions 105 may be formed to have a doping concentration higher than that of the well impurity layer 101.

In some embodiments, a plurality of lower gate electrodes BG may be provided on each of the active portions ACT1 with a gate insulating layer interposed therebetween. The lower gate electrodes BG may be disposed spaced apart from each other in both the first and second directions D1 and D2. Each of the lower gate electrodes BG may be provided between the impurity regions 105 adjacent to each other. Each of the lower strings BSTR of FIG. 2 may include the plurality of lower gate electrodes BG and the plurality of impurity regions 105 arranged along the first direction D1.

A lower insulating layer 110 may be provided on the semiconductor substrate 100 along with the lower gate electrodes BG, and a stack 120 may be provided on the lower insulating layer 110. The stack 120 may include a plurality of word lines WL0-WL5 and a plurality of insulating layers ILD, which are alternatingly stacked on the semiconductor substrate 100. Each of the word lines WL0-WL5 may be a conductive pattern, which is shaped like a plate or comb, and which is provided parallel to a top surface of the semiconductor substrate 100.

The word lines WL0-WL5 of the stack 120 may include may include a conductive material, such as a doped semiconductor (e.g., doped silicon and so forth), metals (e.g., tungsten, copper, aluminum, and so forth), conductive metal nitrides (e.g., titanium nitride, tantalum nitride, and so forth), or transition metals (e.g., titanium, tantalum, and so forth). Thicknesses of the insulating layers ILD of the stack 120 may be variously changed to realize a desired property of a semiconductor memory device. For example, the lowermost one of the insulating layers ILD may be thinner than the others. Further, at least one of the insulating layers ILD may be formed thicker than the others. The insulating layers 120 may be formed of or include a silicon oxide layer.

In example embodiments, a plurality of string selection lines SSL0-SSLn and a plurality of string erase lines ESL0-ESLn may be provided on the stack 120 and may extend parallel to the second direction D2. The string selection lines SSL0-SSLn and the string erase lines ESL0-ESLn may be provided at substantially the same level above the substrate 100. In certain embodiments, when viewed in a plan view, the string selection lines SSL0-SSLn and the string erase lines ESL0-ESLn may be alternatingly disposed in the first direction D1.

In example embodiments, each of the cell strings CSTR may include a semiconductor pillar PL, which is disposed to penetrate the stack 120 and is connected to a corresponding one of the lower transistors BT. For example, the semiconductor pillars PL may be two-dimensionally arranged along the first and second directions D1 and D2. The semiconductor pillars PL may be conductively connected to the lower gate electrodes BG of the lower transistors BT, respectively. For example, the semiconductor pillar PL may have a bottom surface that is positioned below a bottom surface of the lowermost word line WL0 and that is in direct contact with a top surface of the lower gate electrode BG.

The semiconductor pillars PL may be formed of a semiconductor material of the first conductivity type or an intrinsic semiconductor material. The semiconductor pillars PL may be formed to have a solid pillar shape or a hollow cylindrical shape. In the case where the semiconductor pillars PL have the hollow cylindrical shape, an insulating material may be provided to fill an inner space thereof. The semiconductor pillars PL may be formed to have a thickness (i.e., a shell thickness) that is smaller than a width of an inversion region to be formed therein and/or that is smaller than a mean length of silicon grains thereof. Further, an upper impurity region D of the second conductivity type may be formed in or on a top portion of each of the semiconductor pillars PL.

A data storing layer DS may be provided between the word lines WL0-WL5 and the semiconductor pillars PL. The data storing layer DS may extend between the semiconductor pillars PL and the string selection lines SSL0-SSLn. In example embodiments, the data storing layer DS may include a charge storing layer. For example, the data storing layer DS may include one of a trap insulating layer, a floating gate electrode, and/or an insulating layer with conductive nano dots. Data stored in the data storing layer DS may be changed using a Fowler-Nordheim (FN) tunneling effect, which may be caused by a difference in voltage between the semiconductor pillar PL and the word lines WL0-WL5.

In certain embodiments, the data storing layer DS may include a layer (for example, exhibiting a phase-changeable or variable resistance property), which is configured to store data therein based on other physical effects. The data storing layer DS will be described in more detail with reference to FIGS. 11A, 11B, 11C, and 11D.

The string selection lines SSL0-SSLn extend along the second direction D2 across sidewalls of the semiconductor pillars PL. In certain embodiments, the data storing layer DS between the word lines WL0-WL5 and the semiconductor pillars PL may extend between the string selection lines SSL0-SSLn and the semiconductor pillars PL. The string selection lines SSL0-SSLn and the semiconductor pillar PL may constitute MOS capacitors and may control an electric connection between the second bit line BL and the semiconductor pillars PL. As illustrated in FIG. 4, in some embodiments, the semiconductor pillar PL may be formed in such a way that a width thereof is smaller near the string selection lines SSL0-SSLn than near the word lines WL0-WL5.

In some embodiments, the semiconductor pillars PL arranged along the second direction D2 may include portions that are in direct contact with a corresponding one of the string erase lines ESL0-ESLn. The string erase lines ESL0-ESLn may be conductive patterns that are formed to have a different conductivity type from the semiconductor pillars PL. Accordingly, the string erase lines ESL0-ESLn may form PN junctions with the semiconductor pillars PL. In other embodiments, the string erase lines ESL0-ESLn may be conductive patterns, which are formed to have the same conductivity type as the semiconductor pillars PL.

Second bit lines BL0-BL3 may be provided on the string selection lines SSL0-SSLn and the string erase lines ESL0-ESLn, and may extend parallel to the first direction D1. Each of the second bit lines BL0-BL3 may be electrically connected to a row of the semiconductor pillars PL arranged along the first direction D1. The second bit lines BL0-BL3 may be conductive patterns extending parallel to the first direction D1. The second bit lines BL0-BL3 may be connected to the upper impurity regions D of the semiconductor pillars PL.

According to some embodiments of the inventive concept, the semiconductor pillars PL, in conjunction with the word lines WL0-WL5 and the string selection lines SSL0-SSLn, may form MOS field effect transistors using the semiconductor pillars PL as their channel regions. In that case, the word lines WL0-WL5 and the string selection line SSL may serve as gate electrodes of the cell transistors MCT and the string selection transistor SST, respectively, of FIG. 2. Alternatively, the semiconductor pillars PL, in conjunction with the word lines WL0-WL5 and the string selection lines SSL0-SSLn, may form MOS capacitors. In that case, if suitable voltages are applied to the word lines WL0-WL5 and the string selection line SSL0-SSLn, inversion regions may be formed in the semiconductor pillars PL, owing to fringe field to be produced near the word lines WL0-WL5 and the string selection line SSL0-SSLn. In some embodiments, the word lines WL0-WL5 or the string selection lines SSL0-SSLn may be formed in such a way that a thickness thereof is smaller than a maximum length or width of an inversion region to be formed adjacent thereto. Accordingly, the inversion regions may be vertically overlapped with each other in the semiconductor pillar PL to form electric paths between the gate electrode BG of the lower transistor BT and the second bit line BL0-BL3. In each cell string CSTR, the cell transistors MCT to be controlled by the word lines WL0-WL5 may be connected in series to the string selection transistor SST to be controlled by one of the string selection lines SSL0-SSLn.

According to some embodiments of the inventive concepts, an electric potential of the lower gate electrode BG may be changed by controlling the formation of the inversion regions in the semiconductor pillar PL. When the electric potential of the lower gate electrode BG is sufficiently high, an inversion region may be formed in a portion of the semiconductor substrate 100 positioned below the lower gate electrode BG. When the inversion region is formed in the semiconductor substrate 100, the impurity regions 105 adjacent thereto may be electrically connected to each other.

Further, the string erase lines ESL0-ESLn may be in direct contact with the semiconductor pillars PL. In that case, by applying an erase voltage to the string erase lines ESL0-ESLn, it is possible to supply holes into the semiconductor pillars PL, in an erase operation.

Figure 6:
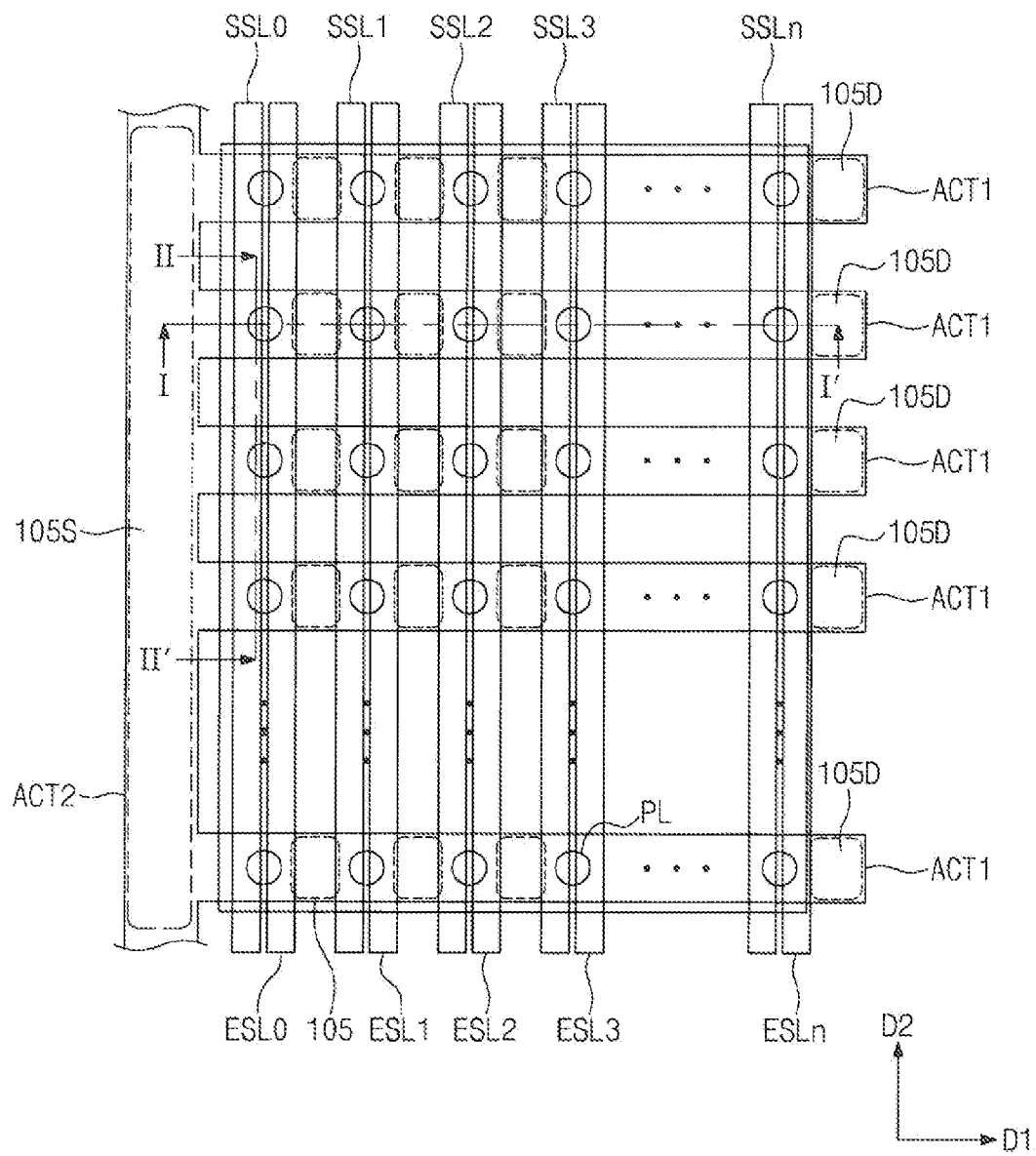
FIG. 6 is a plan view illustrating a three-dimensional semiconductor memory device according to other example embodiments of the inventive concepts.
Figure 7:
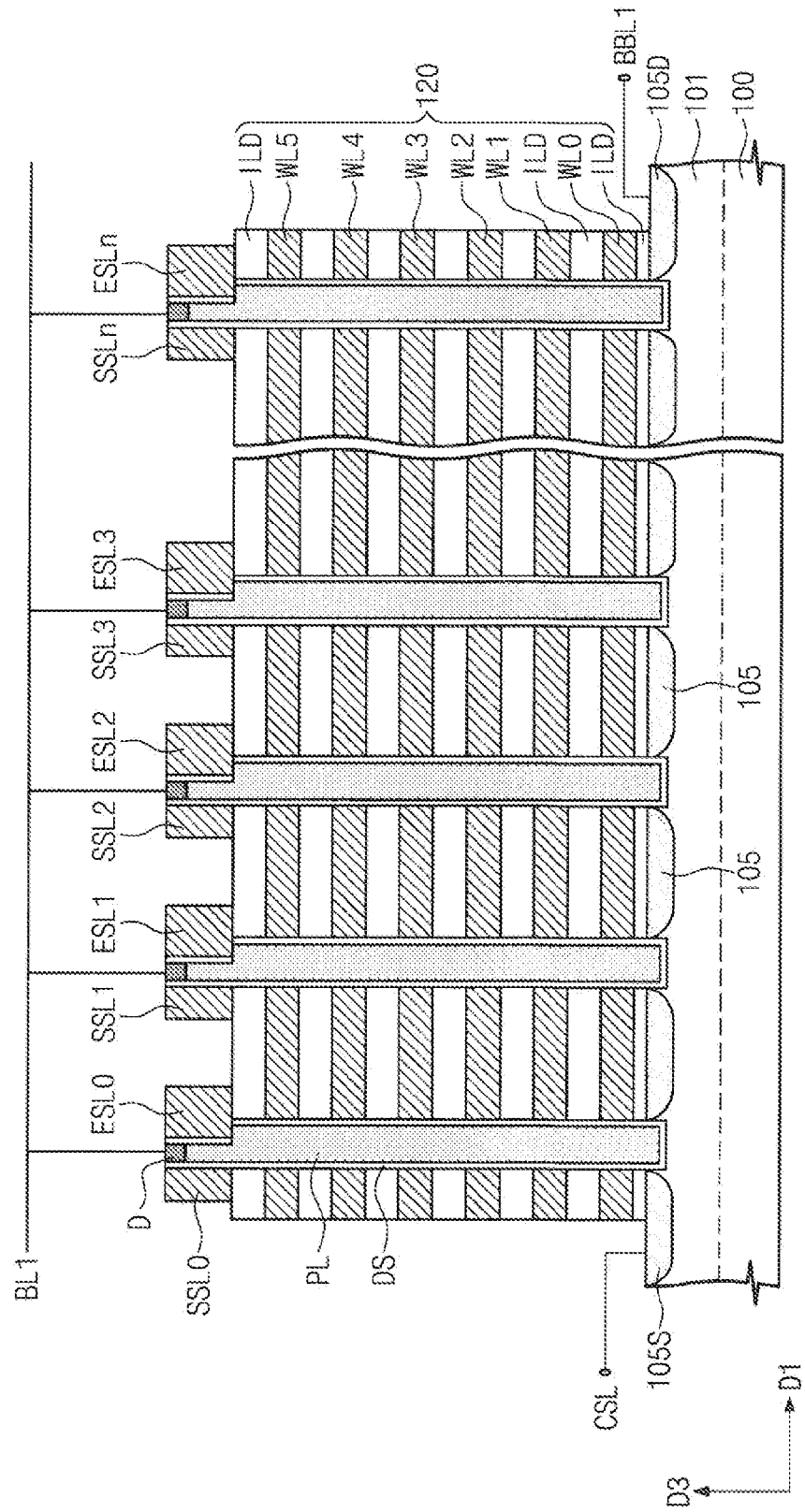
FIGS. 7 and 8 are sectional views taken along lines I-I' and II-II', respectively, of FIG. 6 to schematically illustrate a three-dimensional semiconductor memory device according to other some embodiments of the inventive concepts.
Figure 8:
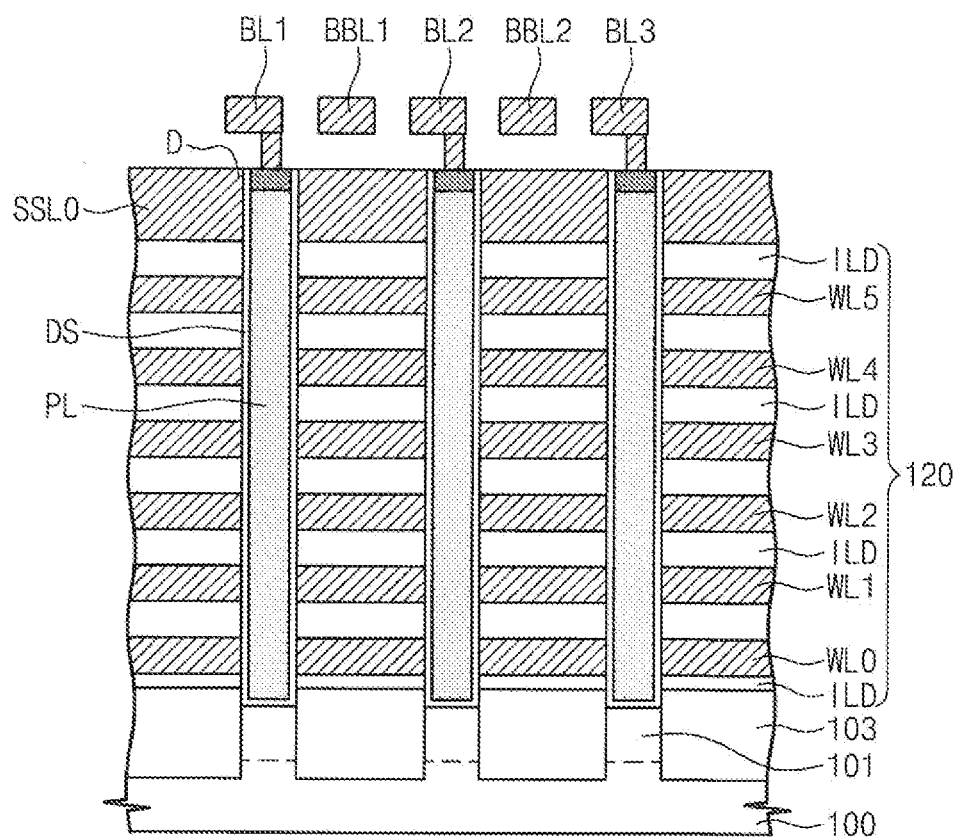

FIG. 6 is a plan view illustrating a three-dimensional semiconductor memory device according to other embodiments of the inventive concepts. FIGS. 7 and 8 are sectional views taken along lines I-I' and II-II', respectively, of FIG. 6, and schematically illustrate a three-dimensional semiconductor memory device according to other embodiments of the inventive concepts.

Referring to FIGS. 6, 7, and 8, a semiconductor substrate 100 may include a plurality of active portions ACT1 and a common active portion ACT2, which are defined by a device isolation layer 103.

In some embodiments, the semiconductor substrate 100 may include a well impurity layer 101 of a first conductivity type. The well impurity layer 101 may be formed by doping the semiconductor substrate 100 with impurities of the first conductivity type. The well impurity layer 101 may be formed in the active portions ACT1 and the common active portion ACT2.

In some embodiments, the active portions ACT1 may extend parallel to a first direction D1 and may be spaced apart from each other in a second direction D2. The common active portion ACT2 may extend parallel to the second direction D2 or perpendicular to the first direction D1 and the active portions ACT1 may be connected in common to the common active portion ACT2. In other embodiments, the common active portion ACT2 may be omitted.

A drain region 105D of a second conductivity type may be formed in an end portion of each of the active portions ACT1, and a common source region 105S of the second conductivity type may be formed in the common active portion ACT2. The common source region 105S may extend parallel to the second direction D2. First bit lines BBL1 may be connected to the drain regions 105D, respectively, and the common source line CSL may be connected to the common source region 105S.

A plurality of impurity regions 105 may be formed in the active portions ACT1 between the drain region 105D and the common source region 105S. The impurity regions 105 may have a different conductivity type from the well impurity layer 101. When viewed in plan view, the impurity regions 105 may be arranged along the first and second directions D1 and D2. The device isolation layer 103 may be provided between the impurity regions 105 adjacent to each other in the second direction D2.

A stack 120 may be provided on the semiconductor substrate 100 with the impurity regions 105. The stack 120 may include a plurality of word lines WL0-WL5 and a plurality of insulating layers ILD, which are alternatingly stacked on the semiconductor substrate 100. The lowermost insulating layer ILD of the stack 120 may cover the impurity regions 105 of the semiconductor substrate 100. As described above, each of the word lines WL0-WL5 may be a conductive pattern, which is shaped like a plate or comb and is parallel to a top surface of the semiconductor substrate 100.

A plurality of string selection lines SSL0-SSLn and a plurality of string erase lines ESL0-ESLn may be provided on the stack 120 and extend parallel to the second direction D2. In certain embodiments, when viewed in a plan view, the string selection lines SSL0-SSLn and the string erase lines ESL0-ESLn may be alternatingly disposed in the first direction D1.

In some embodiments, each of the cell strings CSTR may include a semiconductor pillar PL penetrating the stack 120. The semiconductor pillars PL may be two-dimensionally arranged along the first and second directions D1 and D2. The semiconductor pillars PL may be disposed between the impurity regions 105 adjacent to each other in the first direction D1. In the embodiments illustrated in FIGS. 6-8, the semiconductor pillars PL may have bottom surfaces positioned below a top surface of the semiconductor substrate 100. When the three-dimensional semiconductor memory device is operated, the semiconductor pillars PL and the semiconductor substrate 100 may provide MOS capacitors that control electric connections between adjacent ones of the impurity regions 105 in the first direction D1.

The semiconductor pillars PL may be formed of a semiconductor material of the first conductivity type or an intrinsic semiconductor material. The semiconductor pillars PL may be formed to have a solid pillar shape or a hollow cylindrical shape. When the semiconductor pillars PL have the hollow cylindrical shape, an insulating material may be provided to fill an inner space thereof. The semiconductor pillars PL may have a thickness (i.e., a shell thickness) that is smaller than a width of an inversion region to be formed therein and/or is smaller than a mean length of silicon grains thereof. Further, an upper impurity region D of the second conductivity type may be formed in or on a top portion of each of the semiconductor pillars PL.

A data storing layer DS may be disposed between the word lines WL0-WL5 and the semiconductor pillars PL. In some embodiments, the data storing layer DS may extend between the semiconductor pillars PL and the string selection lines SSL0-SSLn. The data storing layer DS may extend from the regions between the word lines WL0-WL5 and the semiconductor pillars PL and may be interposed between the semiconductor substrate 100 and the bottom surface of the semiconductor pillar PL.

The string selection lines SSL0-SSLn may extend along the second direction D2 across sidewalls of the semiconductor pillars PL. The data storing layer DS between the word lines WL0-WL5 and the semiconductor pillars PL may extend vertically to include a portion disposed between the string selection lines SSL0-SSLn and the semiconductor pillars PL. The string selection lines SSL0-SSLn, in conjunction with the semiconductor pillars PL, may form metal-oxide-semiconductor (MOS) capacitors and may control an electric connection between the second bit lines and the semiconductor pillars PL. In some embodiments, a width of the semiconductor pillar PL may be smaller near the string selection lines SSL0-SSLn than near the word lines WL0-WL5.

Further, the semiconductor pillars PL arranged along the second direction D2 may include portions that are in direct contact with a corresponding one of the string erase lines ESL0-ESLn. The string erase lines ESL0-ESLn may be conductive patterns, which are formed to have a different conductivity type from the semiconductor pillars PL. Accordingly, the string erase lines ESL0-ESLn may form PN junctions with the semiconductor pillars PL. In other embodiments, the string erase lines ESL0-ESLn may be conductive patterns, which are formed to have the same conductivity type as the semiconductor pillars PL.

In some embodiments, the second bit lines BL0-BL3 may be provided on the string selection lines SSL0-SSLn and the plurality of string erase lines ESL0-ESLn to extend along the first direction D1. Each of the second bit lines BL0-BL3 may be electrically connected to a row of the semiconductor pillars PL arranged along the first direction D1. The second bit lines BL0-BL3 may be conductive patterns extending parallel to the first direction D1. The second bit lines BL0-BL3 may be connected to the upper impurity regions D of the semiconductor pillars PL. The drain regions 105D of the semiconductor substrate 100 may be connected to first bit lines BBL0-BBL2, which are disposed on the string selection lines SSL0-SSLn and the string erase lines ESL0-ESLn, along with the second bit lines BL0-BL3.

According to some embodiments of the inventive concepts, the semiconductor pillars PL, in conjunction with the word lines WL0-WL5 and the string selection lines SSL0-SSLn, may form MOS field effect transistors using the semiconductor pillars PI, as their channel regions. In that case, the word lines WL0-WL5 and the string selection line SSL may serve as gate electrodes of the cell transistors MCT and the string selection transistor SST, respectively, of FIG. 2. Alternatively, the semiconductor pillars PL, in conjunction with the word lines WL0-WL5 and the string selection lines SSL0-SSLn, may form MOS capacitors. In that case, if suitable voltages are applied to the word lines WL0-WL5 and the string selection line SSL0-SSLn, inversion regions may be formed in the semiconductor pillars PL, owing to fringe field to be produced near the word lines WL0-WL5 and the string selection line SSL0-SSLn. In some embodiments, the word lines WL0-WL5 or the string selection lines SSL0-SSLn may be formed in such a way that a thickness thereof is smaller than a maximum length and/or width of an inversion region to be formed adjacent thereto. Accordingly, the inversion regions may vertically overlap each other in each of the semiconductor pillars PL to form a vertical current path, allowing for electric access to the selected second bit line BL0-BL3.

The semiconductor pillars PL, in conjunction with the semiconductor substrate 100, may constitute MOS capacitors. In operation, voltages applied to the selected second bit lines BL0-BL3 may be transmitted to bottom surfaces of the semiconductor pillars PL through the vertical current path formed in the semiconductor pillar PL. That is, the voltages applied to the selected second bit lines BL0-BL3 may be used to control electric potentials of the semiconductor pillars PL and form inversion regions in the semiconductor substrate 100 between the impurity regions 105. When such an inversion region is formed in the semiconductor substrate 100, the impurity regions 105 adjacent thereto may be electrically connected to each other. In other words, the semiconductor pillars PL may form MOSFETs, in which the semiconductor substrate 100 is used for channel regions thereof. Furthermore, the semiconductor pillars PL may be used as gate electrodes of such MOSFETs. For example, electric connection between the impurity regions 105 may be controlled by electric potentials of the semiconductor pillars PL.

Figure 9:
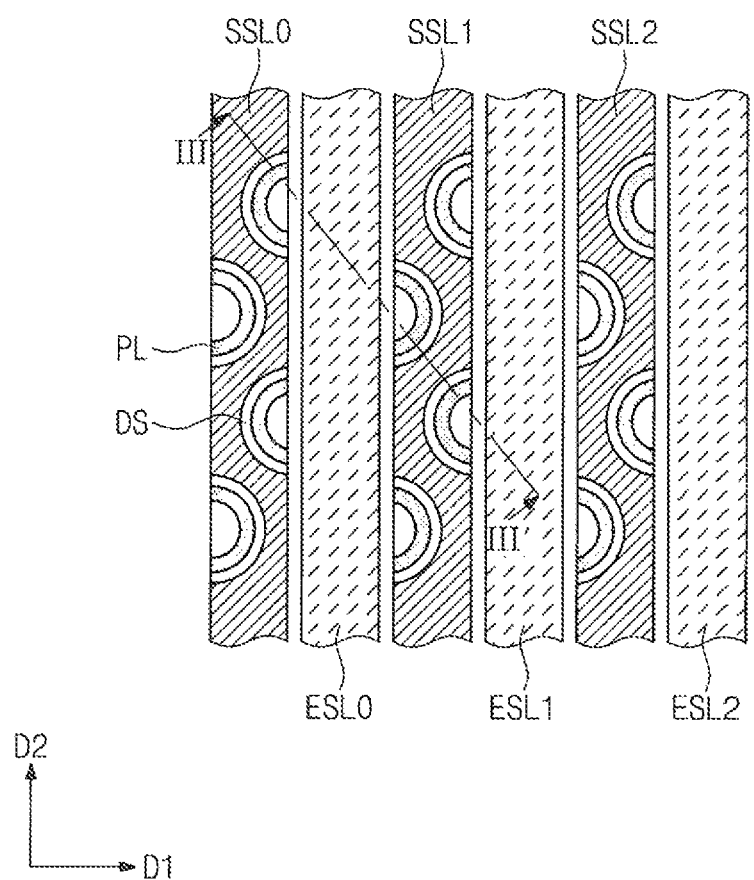
FIG. 9 is a plan view illustrating a portion of a three-dimensional semiconductor memory device according to still other example embodiments of the inventive concepts.
Figure 10:
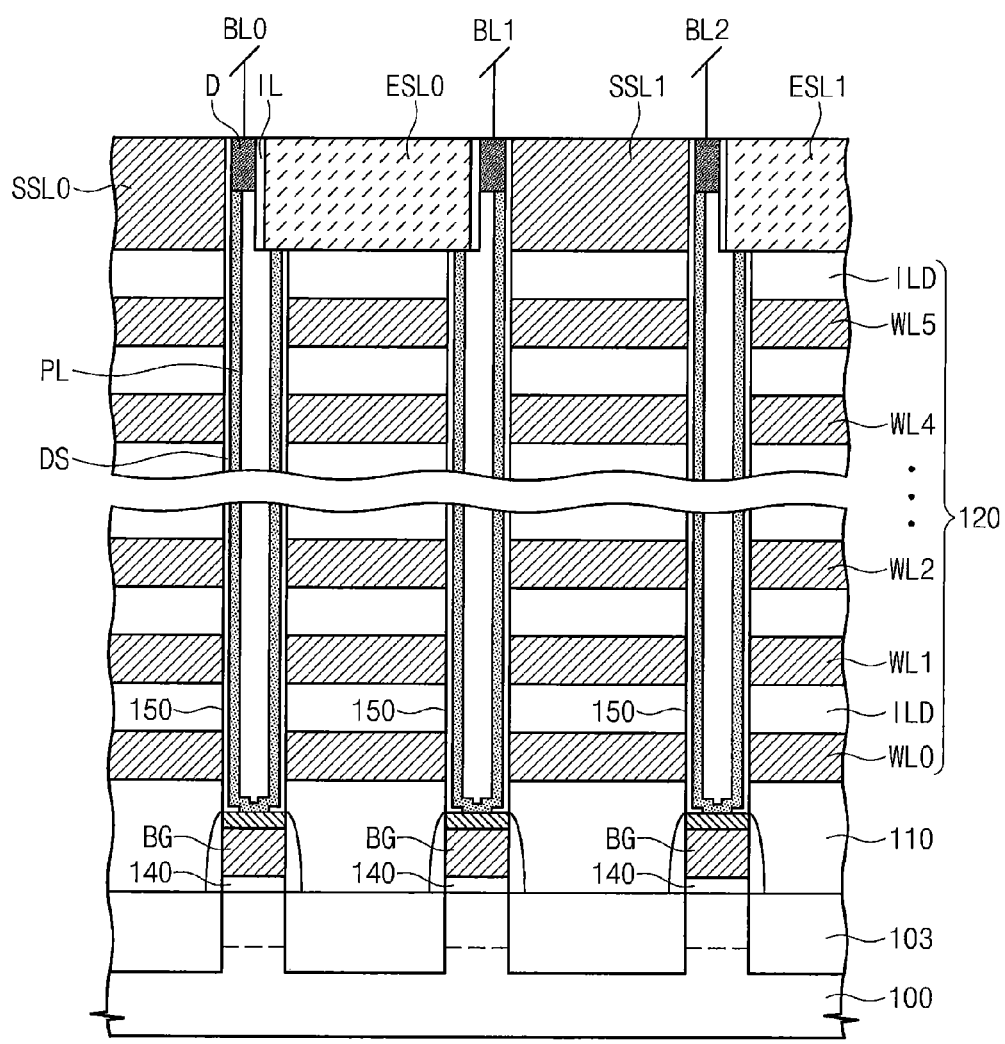
FIG. 10 is a sectional view taken along a line III-III' of FIG. 9 to illustrate a portion of the three-dimensional semiconductor memory device according to still other embodiments of the inventive concepts.

FIG. 9 is a plan view illustrating a portion of a three-dimensional semiconductor memory device according to still other embodiments of the inventive concept. FIG. 10 is a sectional view taken along a line III-III' of FIG. 9 to illustrate a portion of the three-dimensional semiconductor memory device according to still other embodiments of the inventive concept.

Referring to FIGS. 9 and 10, a plurality of lower gate electrodes BG may be disposed spaced apart from each other on the active portion ACT1 (e.g., of FIG. 3) of the semiconductor substrate 100, with a gate insulating layer 140 interposed therebetween. The impurity regions 105 may be formed in portions of the semiconductor substrate 100, which are positioned at both sides of the lower gate electrodes BG. The impurity regions 105 may have a different (or opposite) conductivity type from that of the active portion ACT1. The lower gate electrodes BG and the impurity regions 105 may constitute the lower string BSTR described with reference to FIG. 2.

The lower insulating layer 110 may be provided over and around the lower gate electrodes BG, and the stack 120 may be formed on the lower insulating layer 110. The stack 120 may include a plurality of the word lines WL0-WL5 and a plurality of the insulating layers ILD, which are alternatingly stacked on the semiconductor substrate 100.

The semiconductor pillars PL may be provided to penetrate the stack 120, and the data storing layer DS may be disposed between the stack 120 and the semiconductor pillars PL. The data storing layer DS may include one or more thin films. For example, the data storing layer DS may include a thin-film that can be used as a memory element of a charge-trapping-type nonvolatile memory transistor.

In detail, through holes 150 may be formed to penetrate the stack 120 and expose the lower gate electrodes BG, and the data storing layer DS may be formed on inner side surfaces of the through holes. The data storing layer DS may be removed from bottoms of the through holes to expose the lower gate electrodes BG. In other words, the data storing layer DS may be a hollow cylindrical structure with open both ends. The semiconductor pillars PL may be respectively formed in the through holes with the data storing layer DS. Each of the semiconductor pillars PL may be formed to conformally cover the data storing layer DS and the top surface of the lower gate electrode BG. An insulating material may be provided to fill an inner space of the semiconductor pillar PL. Alternatively, the semiconductor pillars PL may be formed to completely fill the remaining space of the through holes with the data storing layer DS. When viewed in plan view, the semiconductor pillars PL may be arranged spaced apart from each other in both the first and second directions D1 and D2 and in certain embodiments, they may be formed to have a zigzag arrangement in one direction.

In some embodiments, a plurality of string selection lines SSL0-SSL2 and a plurality of string erase lines ESL0-ESL3 may be provided on the stack 120 to extend parallel to the second direction D2. The string selection lines SSL0-SSL2 and the string erase lines ESL0-ESL2 may be alternatingly disposed along the first direction D1. Each of the string selection lines SSL0-SSL2 may be provided to cross the semiconductor pillars PL arranged along the second direction D2 and thereby to cover portions of sidewalls of the semiconductor pillars PL.

Each of the semiconductor pillars PL may have a partially-recessed top surface defining a recess region. For example, the semiconductor pillar PL may be formed in such a way that a width thereof is smaller near the string selection lines SSL0-SSL2 than near the word lines WL0-WL5. Further, an upper impurity region D of the second conductivity type may be formed in or on a top portion of each of the semiconductor pillars PL.

Each of the string erase lines ESL0-ESL2 may be disposed between each adjacent pair of the string selection lines SSL0-SSL2. The string erase lines ESL0-ESL2 may be disposed in the recess regions of the semiconductor pillars PL, which are positioned adjacent to each other in a diagonal direction or in a direction crossing both the first and second directions D1 and D2. An insulating pattern IL may be provided between sidewalls of the recess regions and each of the string erase lines SSL0-SSL2. The string erase lines SSL0-SSL2 and the upper impurity region D may be electrically separated from each other by the insulating pattern IL.

The second bit lines BL0-BL2 extending parallel to the first direction D1 may be provided on the string selection lines SSL0-SSL2 and the string erase lines ESL0-ESL2. Each of the second bit lines BL0-BL2 may be electrically connected in common to the upper impurity regions 105 of the semiconductor pillars PL arranged along the first direction D1.

FIGS. 11A through 11D are sectional views illustrating examples of a data storing layer of a three-dimensional semiconductor memory device according to example embodiments of the inventive concept. For example, each of FIGS. 11A through 11D may represent a portion A shown in FIG. 4.

Referring to FIGS. 11A through 11D, the data storing layer may include a vertical insulator VS and a horizontal insulator HS. The vertical insulator VS may be provided between the semiconductor pillar PL and the word line WL and may be vertically extended to a region between the semiconductor pillar PL and the insulating layer ILD. The horizontal insulator HS may include a vertical portion, which is provided between the vertical insulator VS and the word line WL to cover a side surface of the word line WL, and horizontal portions provided to cover top and bottom surfaces of the word line WL. Each of the vertical and horizontal insulators VS and HS may consist of a single thin film or a plurality of thin films. For example, in the case of charge-trapping-type FLASH memory transistor, the vertical insulator VS may include a tunnel insulating layer, and the horizontal insulator HS may include a blocking insulating layer.

Figure 11A:
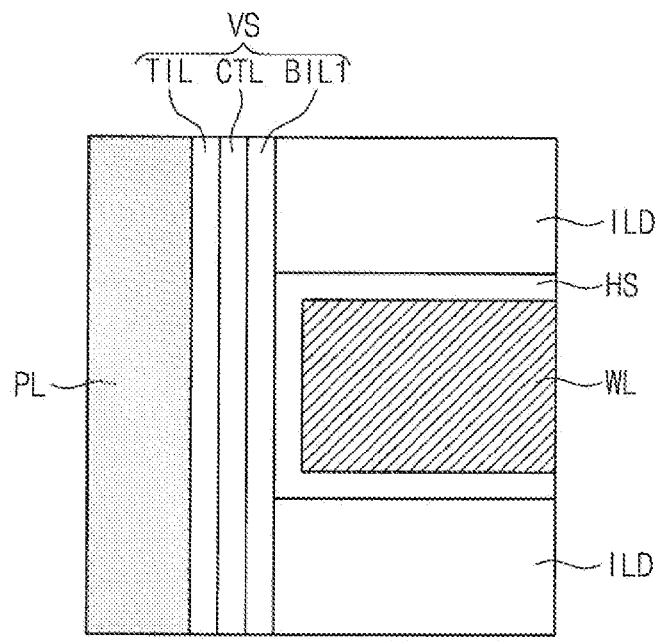
FIGS. 11A through 11D are sectional views of a portion A of FIG. 4, which is provided to illustrate examples of a data storing layer of a three-dimensional semiconductor memory device according to some embodiments of the inventive concepts.
Figure 11B:
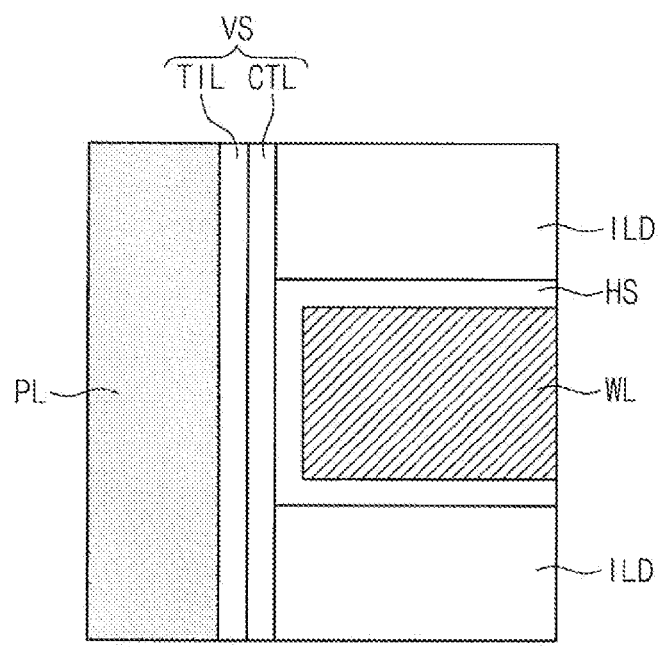
Figure 11C:
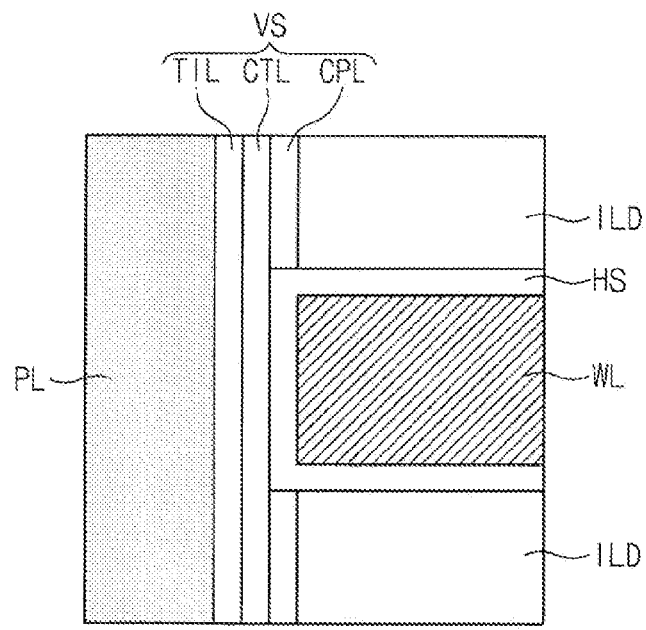
Figure 11D:
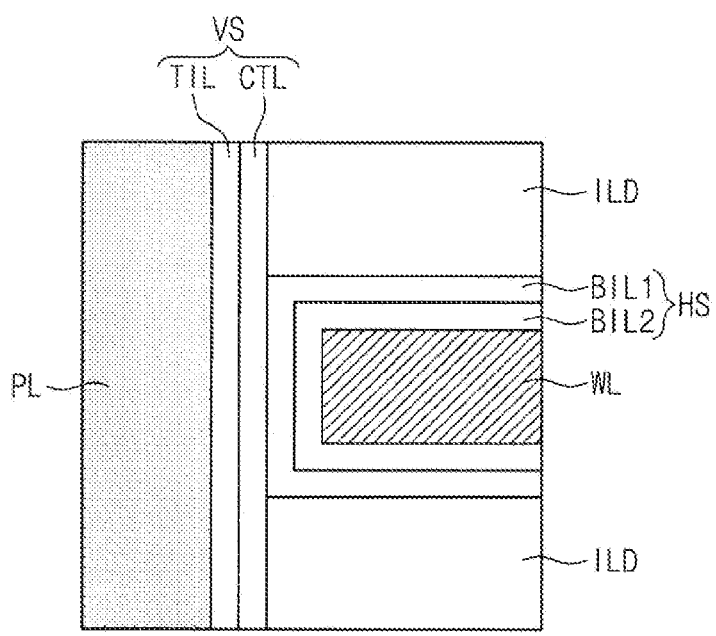

For example, the vertical insulator VS may include a tunnel insulating layer TIL, a charge storing layer CTL, and a first blocking insulating layer BIL, as shown in FIG. 11A. As another example, the vertical insulator VS may include a tunnel insulating layer TIL and a charge storing layer CTL, as shown in FIG. 11B. As other example, the vertical insulator VS may include a tunnel insulating layer TIL, a charge storing layer CTL, and a capping insulating pattern CPL, as shown in FIG. 11C. As still other example, the horizontal insulator HS may include first and second blocking insulating layers BIL1 and BIL2, as shown in FIG. 11D. The capping insulating pattern CPL may include at least two portions vertically separated from each other by the word line WL.

In the embodiments shown in FIGS. 11A through 11D, the charge storing layer CTL may include a trap insulating layer or an insulating layer with conductive nano dots. For example, the charge storing layer CTL may include at least one of a silicon nitride layer, a silicon oxynitride layer, a silicon-rich nitride layer, a nanocrystalline silicon layer, and/or a laminated trap layer. The tunnel insulating layer TIL may be one of materials, whose band gaps are larger than that of the charge storing layer CTL. For example, the tunnel insulating layer TIL may be a silicon oxide layer. The blocking insulating layer corresponding to the horizontal insulator HS may include one of materials, whose band gaps are smaller than that of the tunnel insulating layer TIL and larger than that of the charge storing layer CTL. For example, the blocking insulating layer BIL may include a high-k dielectric material (e.g., aluminum oxide and hafnium oxide). In example embodiments, the blocking insulating layer may have a dielectric constant that is substantially larger than that of the tunnel insulating layer TIL.

Furthermore, in the embodiments shown in FIG. 11D, the first and second blocking insulating layers BIL1 and BIL2 may be formed of different materials. For example, one of the first and second blocking insulating layers BIL1 and BIL2 may be formed of one of materials, whose band gaps are smaller than that of the tunnel insulating layer TIL and the other and are larger than that of the charge storing layer CTL. For example, one of the first and second blocking insulating layers BIL1 and BIL2 may include one of high-k dielectrics (e.g., aluminum oxide and hafnium oxide), and the other may be formed of a silicon oxide layer. Accordingly, the first and second blocking insulating layers BIL1 and BIL2 may have an effective dielectric constant that is substantially larger than that of the tunnel insulating layer TIL.

Figure 13:
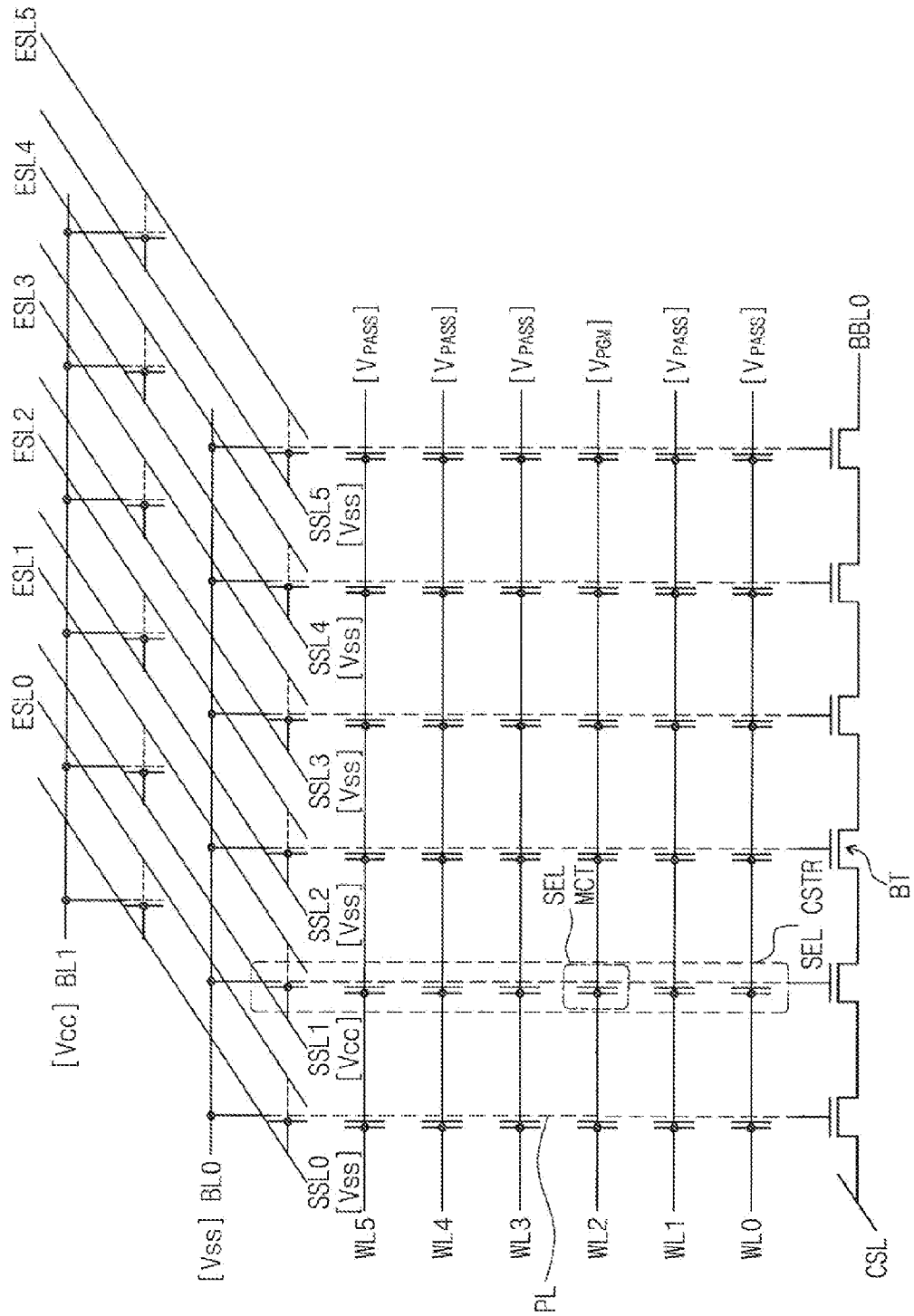
FIG. 13 is a diagram illustrating a program operation of a three-dimensional semiconductor memory device according to some embodiments of the inventive concepts.

FIG. 12 is a table showing an example of a voltage condition for a program operation of a three-dimensional semiconductor memory device according to embodiments of the inventive concepts. FIG. 13 is a diagram illustrating a program operation of a three-dimensional semiconductor memory device according to some embodiments of the inventive concepts.

Referring to FIGS. 12 and 13, a cell string SEL CSTR including a selected memory cell SEL MCT may be selected to write a data in the selected memory cell SEL MCT.

For example, a second bit line BL0 connected to the selected cell string SEL CSTR may be applied with a ground voltage $V_{SS}$, and unselected second bit lines BL1 may be applied with a power supply voltage $V_{CC}$. To electrically connect the selected second bit line BL0 to the selected cell string SEL CSTR, a selected string selection line SSL1 may be applied with the power supply voltage $V_{CC}$, and unselected string selection lines SSL0 and SSL2-SSL5 may be applied with the ground voltage $V_{SS}$ or may be electrically floated.

The word line WL2 connected to the selected memory cell SEL MCT may be applied with a program voltage $V_{PGM}$, and unselected word lines WL0, WL1, and WL3-WL5 may be applied with a pass voltage $V_{PASS}$. Here, the program voltage $V_{PGM}$ may be high enough to inject electric charges from the semiconductor pillar PL to the selected memory cell SEL MCT through an FN tunneling phenomenon. The pass voltage $V_{PASS}$ may be selected to allow the voltages of the second bit lines BL0 and BL1 to be transmitted to portions of the semiconductor pillar PL adjacent to the selected the word line WL2. For example, the pass voltage $V_{PASS}$ may be selected to be higher than a threshold voltage, which is required for forming an inversion region in the semiconductor pillar PL. Further, the pass voltage $V_{PASS}$ may be selected to be smaller than the minimum voltage (hereinafter, a tunneling voltage), which is required for the FN-tunneling phenomenon, and this makes it possible to prevent the unselected memory cells from being unintentionally programmed. In other words, the pass voltage $V_{PASS}$ may range from the threshold voltage to the tunneling voltage.

Under the above voltage condition, the string selection transistor and the unselected memory cell transistors of the selected cell string SEL CSTR may be turned-on. Accordingly, the ground voltage $V_{SS}$ of the selected second bit line BL0 may be transmitted to the semiconductor pillar PL adjacent to the selected the word line WL2 through the inversion regions, which are generated by the pass voltage $V_{PASS}$ applied to the unselected word lines WL0, WL1, and WL3-WL5. Thus, the channel region of the selected memory cell SEL MCT may have substantially the same potential as the selected second bit line BL0, and this may lead to a Fowler-Nordheim (FN) tunneling phenomenon between the selection the word line WL2, which is applied with the program voltage $V_{PGM}$, and the semiconductor pillar PL. In other words, electric charges may be injected to the data storing layer of the selected memory cell SEL MCT from the semiconductor pillar PL.

In the meantime, for the unselected cell strings, in order to prevent the unselected memory cells coupled to the selected the word line WL2 from being unintentionally programmed, the ground voltage $V_{SS}$ may be applied to the unselected string selection lines SSL0 and SSL2-SSL5, and thus, the unselected string selection transistors may be turned-off. Accordingly, the unselected the semiconductor pillars PL connected to the selected second bit line BL0 may be in an electrically floating state. In this case, due to the program voltage $V_{PGM}$ applied to the selected the word line WL2, the unselected the semiconductor pillars PL connected to the selected second bit line BL0 may have an elevated or boosted potential. The boosted potential of the unselected active pillars PL may lead to a reduction in voltage difference between the selected the word line WL2 and the unselected active pillars PL, and this makes it possible to prevent the unselected memory cells connected to the selected the word line WL2 from being unintentionally programmed.

According to example embodiments, during the programming operation, the common source line CSL and the first bit lines BBL0 may be in the electrically floating state. Accordingly, during the programming operation, there may be no current flow passing through the lower string. Further, during the programming operation, string erase lines ESL0-ESL5 in contact with the semiconductor pillars PL may be in the electrically floating state.

Figure 15:
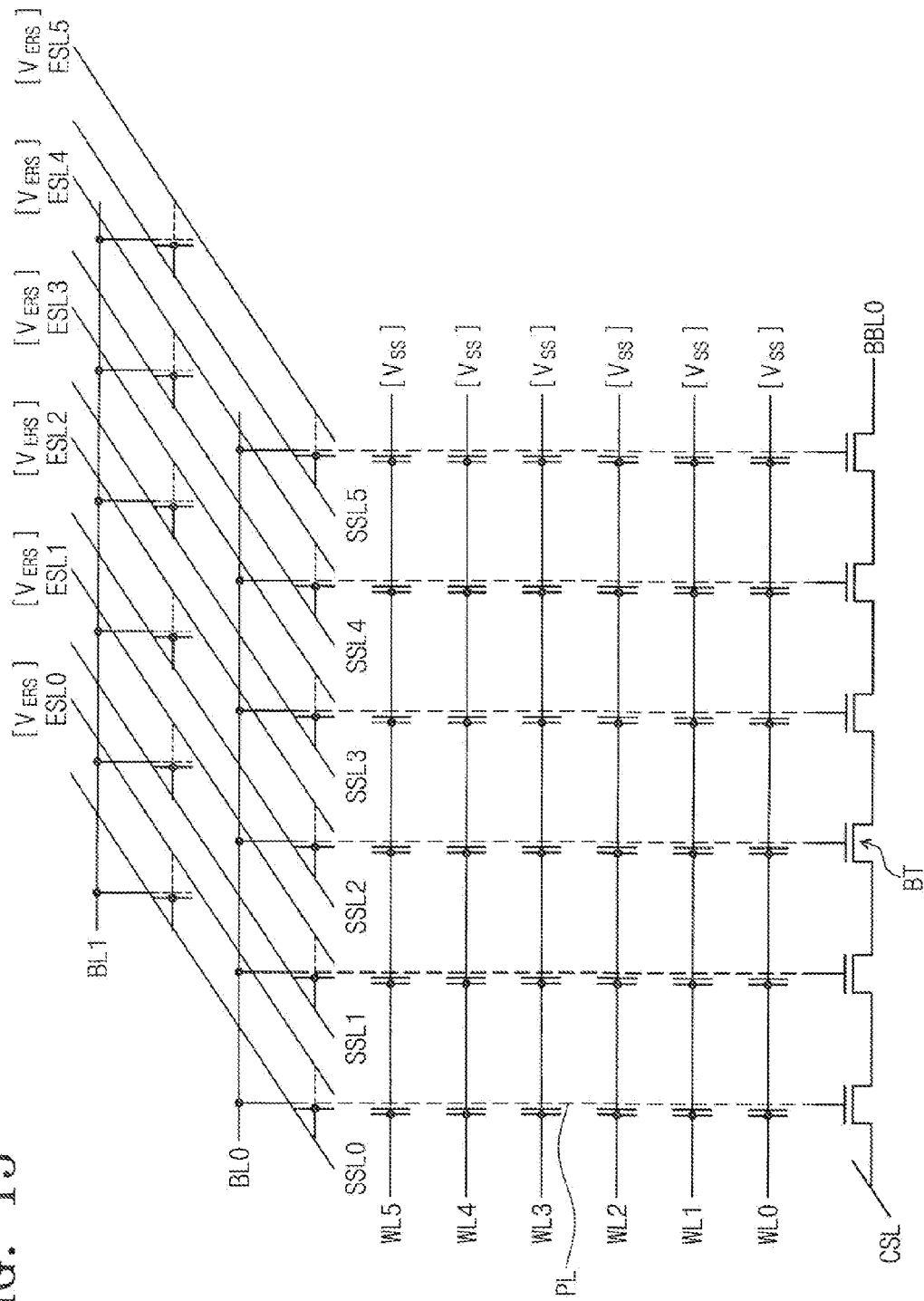
FIG. 15 is a diagram illustrating an erase operation of a three-dimensional semiconductor memory device according to some embodiments of the inventive concepts.

FIG. 14 is a table showing an example of a voltage condition for an erase operation of a three-dimensional semiconductor memory device according to embodiments of the inventive concepts. FIG. 15 is a diagram illustrating an erase operation of a three-dimensional semiconductor memory device according to embodiments of the inventive concepts.

Referring to FIGS. 14 and 15, an erase voltage $V_{ERS}$ may be applied to the string erase lines ESL0-ESL5, and the ground voltage $V_{SS}$ may be applied to the word lines WL0-WL5. The first and second bit lines BL and BBL, the string selection lines SSL0-SSL5, and the common source line CSL may be in the electrically floating state.

Under the voltage condition, a voltage difference, which is high enough to cause a Fowler-Nordheim (FN) tunneling phenomenon, may be formed between the word lines WL0-WL5 and the semiconductor pillars PL. Accordingly, electric charges stored in the data storing layers of the memory cells may be discharged to the semiconductor pillars PL. Here, the memory cells of the cell strings of the string erase lines ESL0-ESL5 may be erased at the same time.

Figure 17:
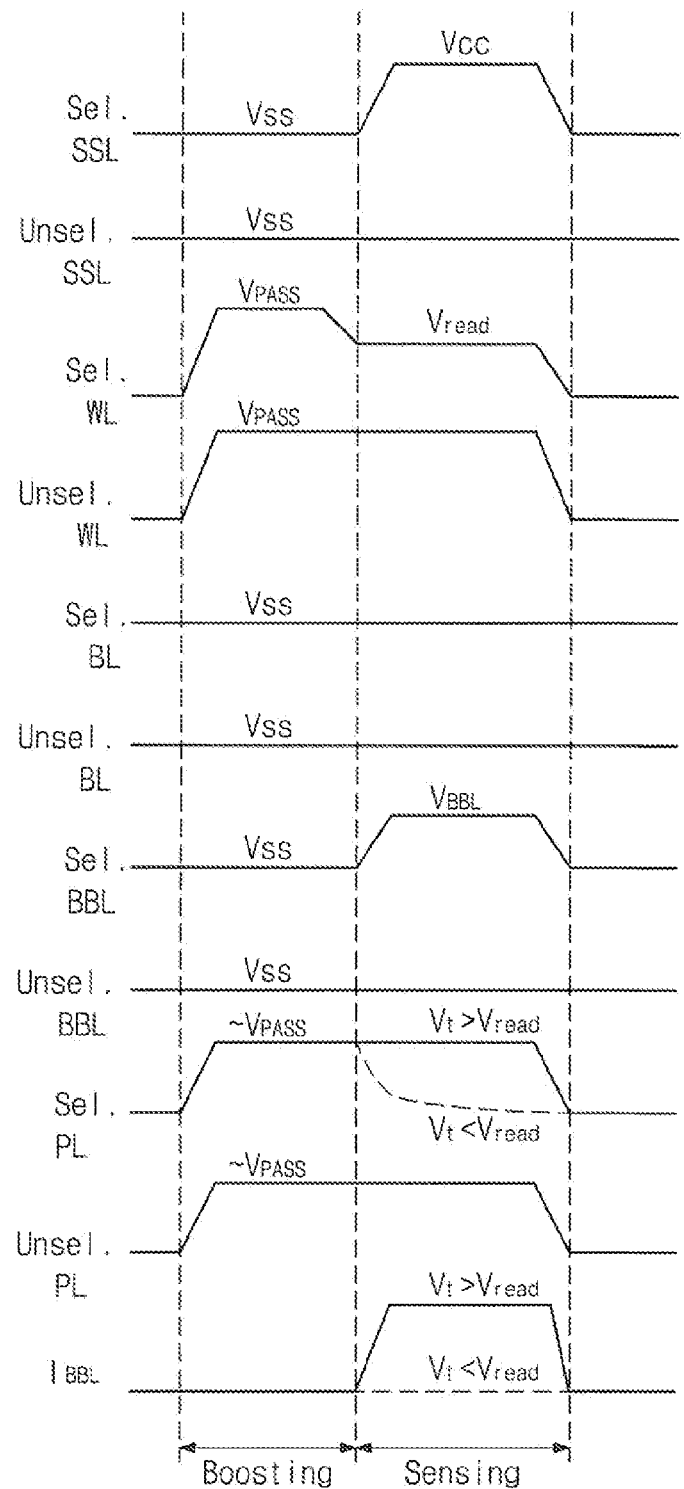
FIG. 17 is a timing diagram for performing the read operation using the voltage condition of FIG. 16.

FIG. 16 is a table showing an example of a voltage condition for a read operation of a three-dimensional semiconductor memory device according to embodiments of the inventive concepts. FIG. 17 is a timing diagram for performing the read operation using the voltage condition of FIG. 16, and FIG. 18 is a diagram illustrating a read operation of a three-dimensional semiconductor memory device according to embodiments of the inventive concepts.

Figure 18:
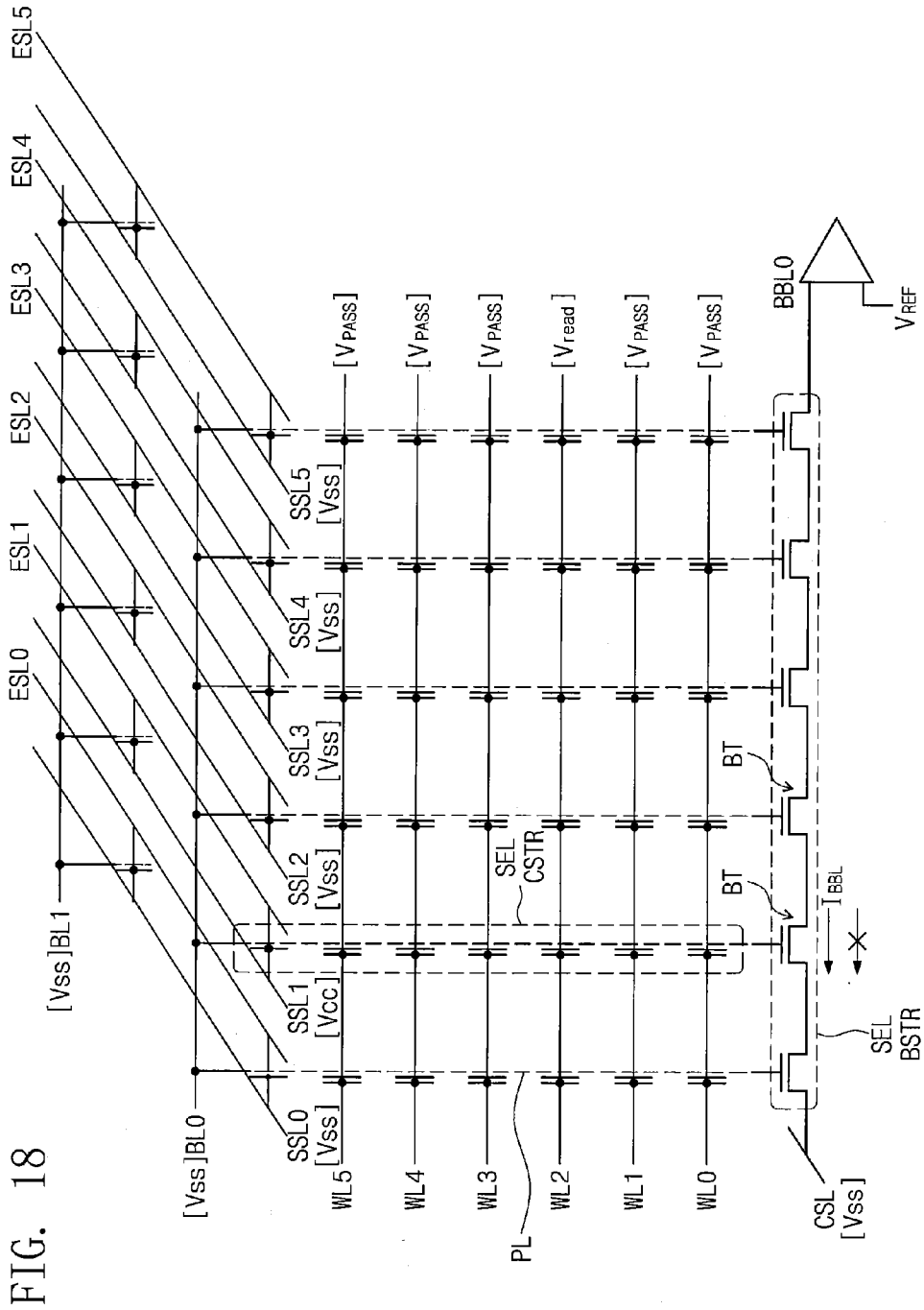
FIG. 18 is a diagram illustrating a read operation of a three-dimensional semiconductor memory device according to some embodiments of the inventive concepts.

Referring to FIGS. 16, 17, and 18, in the case where an electric potential of the semiconductor pillar PL of the selected cell string SEL CSTR is changed, there may be a variation in amount of a current passing through the selected lower string SEL. BSTR, and thus, by sensing the variation of the current amount, it is possible to read data stored in the memory cell.

According to example embodiments of the inventive concept, before selecting the cell string, a boosting operation may be performed to boost electric potentials of all semiconductor pillars PL. As a result of the potential boosting of the semiconductor pillars PL, all of the lower transistors BT connected to the semiconductor pillars PL may be turned on to form current paths between the first bit lines BBL0 and the common source line CSL. For this, the ground voltage $V_{SS}$ may be applied to all of the second bit lines BL0 and BL1 and all of the string selection lines SSL0-SSL5, and the pass voltage $V_{PASS}$ may be applied to all of the word lines WL0-WL5. The pass voltage $V_{PASS}$ may be selected to turn on all of the memory cell transistors. Under the above voltage condition, owing to a capacitive coupling between the word lines WL0-WL5 and the semiconductor pillars PL, a voltage of the semiconductor pillars PL (i.e., the gate electrodes of the lower transistors) may be elevated (e.g., approximately to the pass voltage $V_{PASS}$). The voltage (e.g., the pass voltage $V_{PASS}$) of the semiconductor pillars PL may be higher than a threshold voltage of the lower transistors BT. During the reading operation, the string erase lines ESL0-ESL5 in contact with the semiconductor pillars PL may be in the electrically floating state.

After the boosting of the electric potential of the semiconductor pillars PL, the cell string SEL CSTR including the selected memory cell may be selected. For this, a read voltage Vread may be applied to the selected the word line WL2, and the power supply voltage $V_{CC}$ may be applied to the selected string selection line SSL1. A bit line voltage $V_{BBL}$ may be applied to the selected first bit line BBL0, and the ground voltage $V_{SS}$ may be applied to the common source line CSL.

The selected memory cell transistor may be turned-on by the read voltage Vread applied to the selected the word line WL2, and thus, a current path (or channel) may be formed between the lower transistor BT and the second bit line BL0. In other words, when the threshold voltage of the selected memory cell transistor is smaller than the read voltage Vread (i.e., Vt<$V_{READ}$), an inversion region may be formed in the semiconductor pillar PL adjacent to the selected memory cell, and thus, the ground voltage $V_{SS}$ applied to the second bit line BL0 may be delivered to the gate electrode of the lower transistor BT through the selected semiconductor pillar PL. Accordingly, the electric potential of the semiconductor pillar PL may be decreased to turn off the selected lower transistor BT. As a result, the current path, which was formed between the common source line CSL and the selected first bit line BBL0 in the boosting stage, may be cut. In other words, a lower string current $I_{BBL}$ flowing through the selected lower string SEL BSTR may be reduced. For example, there is not current flowing through the first bit line BBL0. In the sense amplifier, a lower string current $I_{BBL}$ flowing through the first bit line BBL0 may be sensed to read data stored in the selected memory cell.

By contrast, in the case where the selected memory cell transistor is turned-off by the read voltage Vread applied to the selected the word line WL2, the current path formed in the semiconductor pillar PL during the boosting state may be cut at the selected memory cell transistor. In other words, if the threshold voltage of the selected memory cell transistor is higher than the read voltage Vread (i.e., $V_t$>$V_{READ}$), the inversion region may not be formed in the semiconductor pillar PL adjacent to the selected memory cell. Accordingly, the electric potential (e.g., the pass voltage $V_{PASS}$) of the semiconductor pillar PL may be substantially unchanged. As a result, it is possible to preserve the current path, which was formed in the selected lower string SEL BSTR during the boosting stage. In this case, there is an electric current flowing through the first bit line BBL0, and in the sense amplifier, this may be sensed to read data stored in the selected memory cell.

Figure 20:
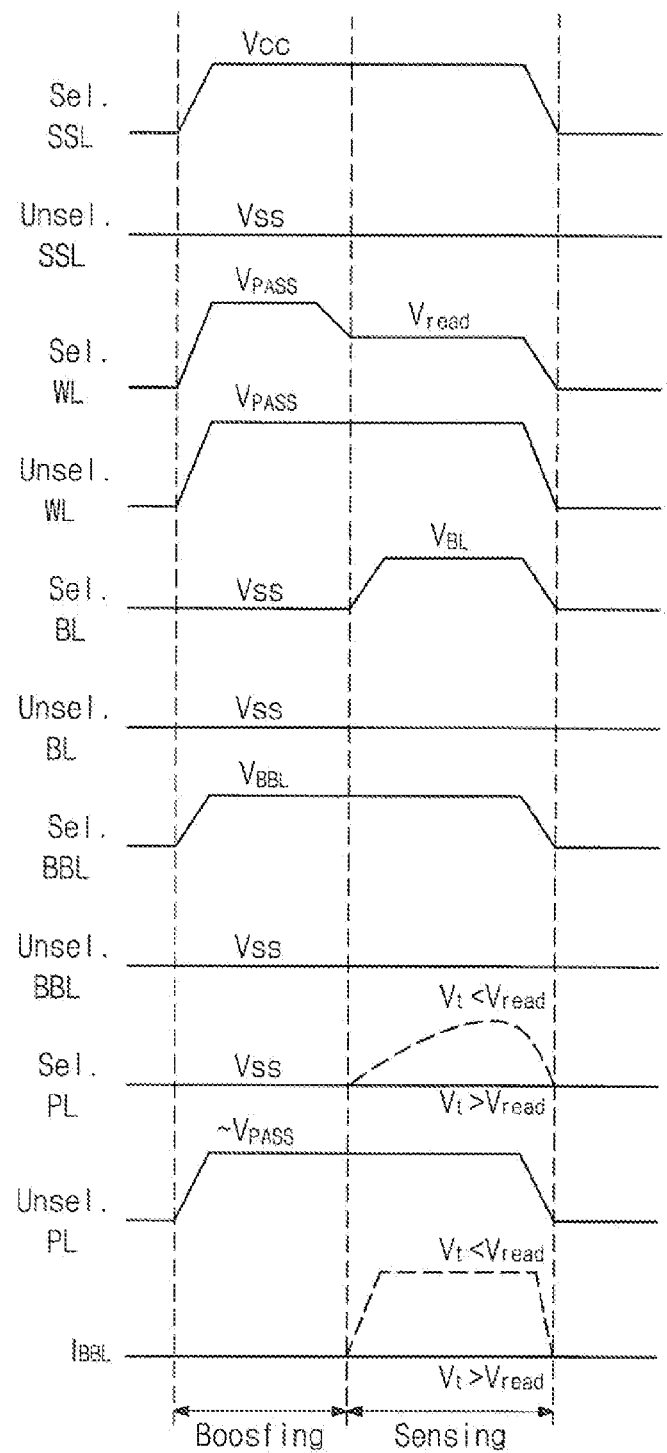
FIG. 20 is a timing diagram for performing the read operation using the voltage condition of FIG. 19.

FIG. 19 is a table showing another example of a voltage condition for a read operation of a three-dimensional semiconductor memory device according to embodiments of the inventive concepts. FIG. 20 is a timing diagram showing temporal changes in voltages applied to and currents flowing through some elements of a three-dimensional semiconductor memory device, when the read operation is performed using the voltage condition of FIG. 19.

Referring to FIGS. 19 and 20, a cell string including the selected memory cell may be selected to read out data stored in the selected memory cell. For this, the selected string selection line SSL may be applied with the power supply voltage $V_{CC}$, and the unselected string selection lines SSL may be applied with the ground voltage $V_{SS}$. All of the word lines WL may be applied with the pass voltage $V_{PASS}$, and the second bit lines BL may be applied with the ground voltage $V_{SS}$. The pass voltage $V_{PASS}$ may be selected to turn on all of the memory cell transistors. The selected first bit line BBL may be applied with the bit line voltage $V_{BBL}$, and the common source line CSL may be applied with the ground voltage $V_{SS}$. During the reading operation, the string erase lines ESL0-ESL5 in contact with the semiconductor pillars PL may be in the electrically floating state.

According to the above voltage condition, the ground voltage $V_{SS}$ may be applied to the unselected string selection lines SSL, and thus, the unselected string selection transistors may be turned off. Thus, the semiconductor pillars of the unselected cell strings may not be electrically connected to the second bit lines BL and may be in the electrically floating state. In this case, owing to a capacitive coupling between the word lines WL0-WL5 and the semiconductor pillars, an electric potential of the unselected semiconductor pillars (e.g., the gate electrodes of the lower transistors) may be elevated (e.g., to approximately the pass voltage $V_{PASS}$). The voltage (e.g., the pass voltage $V_{PASS}$) of the semiconductor pillars PL may be higher than a threshold voltage of the lower transistors BT. Due to the elevated electric potential (e.g., the pass voltage $V_{PASS}$) of the semiconductor pillars PL, the lower transistors may be turned on.

For the selected cell string, the string selection transistor connected to the selected string selection line SSL is turned on, and the ground voltage $V_{SS}$ may be delivered to the selected semiconductor pillar. Accordingly, the ground voltage $V_{SS}$ may be delivered to the gate electrode of the lower transistor connected to the selected semiconductor pillar, and the lower transistor connected to the selected cell string may be turned-off. In other words, during the boosting stage, it is possible to prevent the lower string electric current $I_{BBL}$ from being flowed.

After boosting the unselected semiconductor pillars, the read voltage Vread may be applied to the selected one of the word lines WL2, and a bit line voltage $V_{BL}$ may be applied to the selected second bit line BL.

Under the voltage condition, the selected memory cell transistor may be turned-on by the read voltage Vread applied to the selected the word line WL, and thus, a current path (or channel) may be formed between the lower transistor BT and the second bit line BL. In other words, when the threshold voltage of the selected memory cell transistor is smaller than the read voltage Vread (i.e., $Vt<V_{READ}$), an inversion region may be formed in the semiconductor pillar PL adjacent to the selected memory cell, and thus, the bit line voltage $V_{BL}$ applied to the second bit line BL may be delivered to the gate electrode of the lower transistor BT through the selected semiconductor pillar PL. Accordingly, the electric potential of the selected semiconductor pillar PL may be elevated to turn on the lower transistor BT connected to the selected semiconductor pillar PL. As a result, during the boosting stage, a current path may be formed between the common source line CSL and the selected first bit line BBL. In other words, there may be a lower string electric current $I_{BBL}$ flowing through the selected first bit line BBL, and in the sense amplifier, this may be sensed to read data stored in the selected memory cell.

By contrast, in the case where the selected memory cell transistor is turned-off by the read voltage Vread applied to the selected the word line WL, the current path formed in the semiconductor pillar PL during the boosting state may be cut at the selected memory cell transistor. In other words, if the threshold voltage of the selected memory cell transistor is higher than the read voltage Vread (i.e., $V_t>V_{READ}$), the inversion region may not be formed in the semiconductor pillar PL adjacent to the selected memory cell. Accordingly, the electric potential (e.g., the ground voltage $V_{SS}$) of the selected semiconductor pillar PL may be substantially unchanged. As a result, the lower transistor connected to the selected cell string may be turned-off to prevent the lower string current $I_{BBL}$ from flowing through the selected first bit line BBL, and this may be sensed by the sense amplifier to determine data stored in the selected memory cell.

Figure 21:
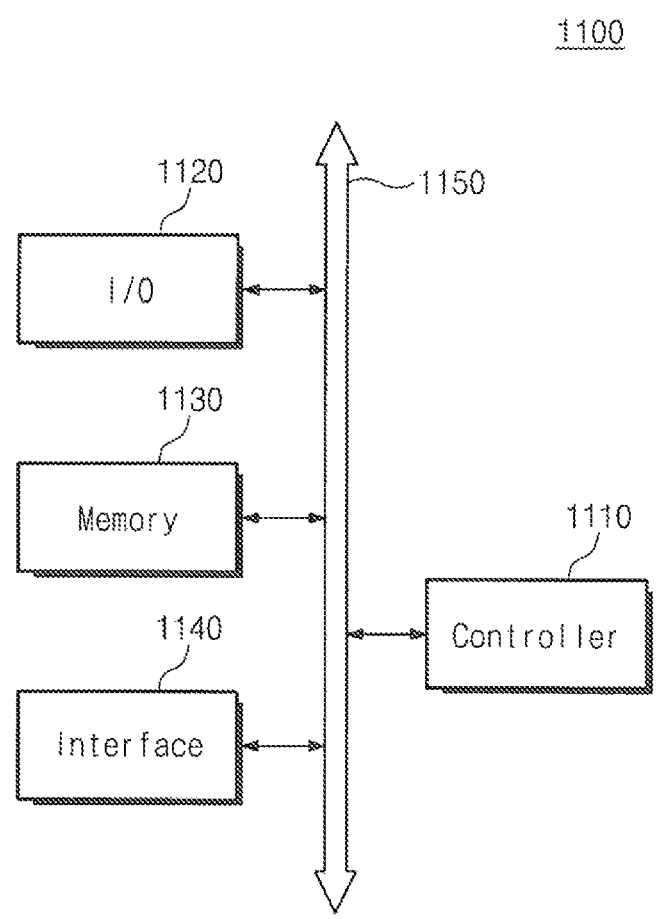
FIG. 21 is a schematic block diagram illustrating an example of a memory system including a three-dimensional semiconductor memory device according to some embodiments of the inventive concepts.

FIG. 21 is a schematic block diagram illustrating an example of a memory system including a three-dimensional semiconductor memory device according to example embodiments of the inventive concept.

Referring to FIG. 21, a memory system 1100 may be used to realize information processing devices, such as PDA, portable computers, web tablets, cordless phones, mobile phones, digital music players, memory cards, and wired or wireless communication devices.

The memory system 1100 may include a controller 1110, an input-output unit 1120 (e.g., keypad, keyboard, and display), a memory 1130, an interface 1140, and a bus 1150. The memory 1130 and the interface 1140 may communicate with each other via the bus 1150.

The controller 1110 may include at least one of microprocessor, digital signal processor, a microcontroller, or other similar processing devices. The memory 1130 may be configured to store data or command processed by the controller 1110. The input-output unit 1120 may be configured to receive or output data or signals from or to the outside of the system 1100 or system 1100. For example, the input-output unit 1120 may include a keyboard, a keypad, or a display device.

The memory 1130 may include a nonvolatile memory device according to example embodiments of the inventive concept. The memory 1130 may further include a randomly accessible volatile memory or any other type memory device.

The interface 1140 may be configured to receive or output data or signals from or to a communication network.

Figure 22:
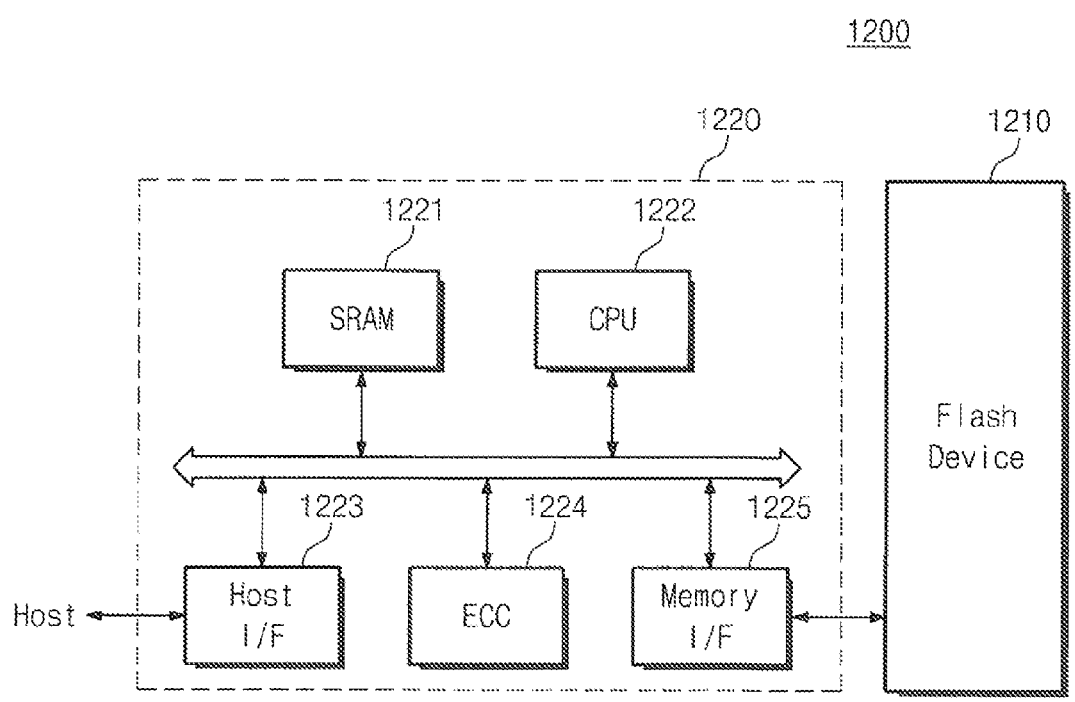
FIG. 22 is a block diagram exemplarily illustrating an example of a memory card including the three-dimensional semiconductor memory devices according to some embodiments of the inventive concepts.

FIG. 22 is a block diagram exemplarily illustrating an example of a memory card including the three-dimensional semiconductor memory devices according to embodiments of the inventive concepts.

Referring to FIG. 22, a memory card 1200 may be configured to include a semiconductor memory device 1210, which may be the three-dimensional semiconductor memory devices according to example embodiments of the inventive concept. The memory card 1200 includes a memory controller 1220 configured to control a data exchange operation between a host and the semiconductor memory device 1210.

A static random access memory (SRAM) 1221 is used as an operation memory of a processing unit 1222. A host interface 1223 includes data exchange protocols of a host to be connected to the memory card 1200. An error correction block 1224 detects and corrects errors included in data readout from a multi bit semiconductor memory device 1210. A memory interface 1225 interfaces with the semiconductor memory device 1210. The processing unit 1222 performs every control operation for exchanging data of the memory controller 1220. Even though not depicted in drawings, it is apparent to one of ordinary skill in the art that the memory card 1200 according to example embodiments of the inventive concept may further include a ROM ((not shown)) storing code data for interfacing with the host.

Figure 23:
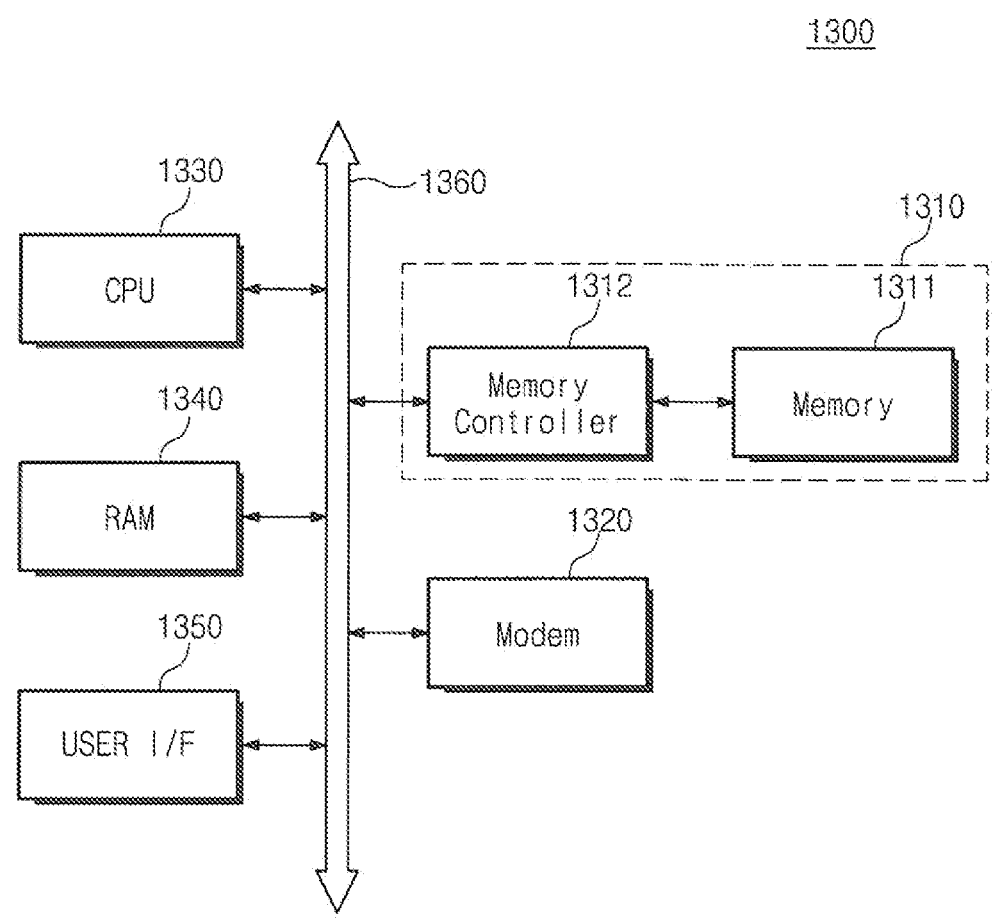
FIG. 23 is a schematic block diagram exemplarily illustrating an example of an information processing system including the three-dimensional semiconductor memory devices according to some embodiments of the inventive concepts.

FIG. 23 is a schematic block diagram exemplarily illustrating an example of an information processing system including the three-dimensional semiconductor memory devices according to embodiments of the inventive concepts.

Referring to FIG. 23, an information processing system 1300 may be realized using a memory system 1310 including at least one of the three-dimensional semiconductor memory devices according to example embodiments of the inventive concept. For instance, the information processing system 1300 may be a mobile device and/or a desktop computer. In some embodiments, the information processing system 1300 may further include a modem 1320, a central processing unit (CPU) 1330, a random access memory (RAM) 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory card 1200 described with respect to FIG. 22. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it is apparent to those skilled in the art that, for example, an application chipset, a camera image sensor, a camera image signal processor (ISP), an input/output device, or the like may further be included in the information processing system 1300 according to the inventive concept.

Semiconductor devices or memory systems according to example embodiments of the inventive concept can be packaged using any of various types of packages. For example, a semiconductor device according to example embodiments of the inventive concept can be packaged with methods such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multichip package (MCP), wafer-level fabricated package (WFP), wafer-level processed stack package (WSP) and mounted.

According to example embodiments of the inventive concept, a three-dimensional semiconductor memory device may include a lower string and a plurality of cell strings coupled to the lower string. In the device, a programming operation may be performed using second bit lines connected to the cell strings, and a reading operation may be performed using a first bit line connected to the lower string. In the reading operation of the device, a current flowing through the lower string may be sensed. This makes it possible to increase a sensing margin in a sense amplifier, because an amount of the current flowing through the lower string is greater than that of a read current flowing through a cell string of a conventional structure.

While example embodiments of the inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
   a semiconductor substrate including a common source region and a drain region therein;
   a lower structure on the semiconductor substrate, the lower structure comprising a plurality of lower transistors connected in series between the common source region and the drain region, the plurality of lower transistors having respective lower gate electrodes;
   a stack including a plurality of word lines stacked on the lower structure; and
   semiconductor pillars penetrating the stack, wherein the plurality of word lines and the semiconductor pillars form a plurality of memory cell transistors, and wherein each of a first plurality of the semiconductor pillars is conductively connected to a respective one of the lower gate electrodes of the lower transistors.

2. The device of claim 1, wherein the lower gate electrodes are spaced apart from each other on the semiconductor substrate, and wherein the lower structure further comprises a plurality of impurity regions in the semiconductor substrate between respective pairs of the lower gate electrodes.

3. The device of claim 2, wherein each of the first plurality of the semiconductor pillars is in direct contact with the respective one of the lower gate electrodes.

4. The device of claim 1, wherein the semiconductor substrate further comprises a plurality of impurity regions arranged between the common source region and the drain region along one direction, and
   the semiconductor pillars form the lower gate electrodes of the lower transistors.

5. The device of claim 1, wherein the semiconductor pillars are arranged in first and second directions perpendicular to each other, when viewed in a plan view, and
   the device further comprises:
   bit lines, each of which connects respective ones of the semiconductor pillars arranged along the first direction;
   string selection lines provided on the stack and crossing respective ones of the semiconductor pillars arranged along the second direction, wherein the string selection lines face sidewalls of the semiconductor pillars; and
   a vertical insulating layer between the stack and the semiconductor pillars and between the string selection lines and the semiconductor pillars.

6. The device of claim 1, further comprising string erase lines on the stack and extending parallel to the string selection lines, wherein the string erase lines are in direct contact with portions of the semiconductor pillars.

7. The device of claim 6, wherein a width of each of the semiconductor pillars is smaller adjacent the string erase lines than adjacent the word lines.

8. The device of claim 1, wherein the semiconductor pillars have a thickness that is smaller than a width of an inversion region to be formed in the semiconductor pillars upon application of a voltage to one of the word lines and/or that is smaller than a mean length of silicon grains of the semiconductor pillar.

9. The device of claim 1, wherein the semiconductor pillars comprise hollow semiconductor pillars.

10. A three-dimensional semiconductor memory device, comprising:
    a lower string connecting a common source line to a first bit line, the lower string including a plurality of lower transistors connected in series to each other between the common source line and the first bit line; and
    a plurality of cell strings, each of which includes a plurality of memory cells connected in series between the lower string and a second bit line, each of the plurality of cell strings being configured to control a gate electrode of a corresponding one of the lower transistors.

11. The device of claim 10, wherein each of the cell strings further comprises a string selection transistor connecting the second bit line to a memory cell adjacent to the second bit line in series.

12. The device of claim 10, further comprising a plurality of word lines vertically stacked on a semiconductor substrate, wherein each of the cell strings comprises:
    a semiconductor pillar penetrating the word lines; and
    a vertical insulating layer disposed between the word lines and the semiconductor pillar.

13. The device of claim 12, further comprising a string erase line in direct contact with portions of the semiconductor pillars.

14. The device of claim 12, wherein a width of each of the semiconductor pillars is smaller adjacent the string erase line than adjacent the word lines.

15. The device of claim 10, further comprising a read and write circuit electrically connected to the first and second bit lines.

16. The device of claim 10, wherein the lower string comprises a plurality of lower gate electrodes that are spaced apart from each other on a semiconductor substrate, and impurity regions that are formed in the semiconductor substrate between respective pairs of the lower gate electrodes.

17. The device of claim 10, wherein the lower string further comprises:
a common source region in a semiconductor substrate and electrically connected to the common source line;
a drain region in the semiconductor substrate and electrically connected to the first bit line; and
a plurality of impurity regions in the semiconductor substrate and arranged between the common source region and the drain region,
wherein each of the cell strings comprises a semiconductor pillar that controls an electric connection between adjacent ones of the plurality of impurity regions.

18. A three-dimensional semiconductor memory device, comprising:
a semiconductor substrate;
a lower string including a common source region, a drain region and a plurality of lower transistors connected in series between the common source region and the drain region; and
a plurality of cell strings, each of the plurality of cell strings being provided on a respective one of the lower transistors and comprising a plurality of memory cells connected in series between the respective one of the lower transistors and a bit line,
wherein each of the plurality of cell strings controls a gate electrode of a corresponding one of the lower transistors.

19. The device of claim 18, wherein the plurality of cell strings comprises:
a stack including a plurality of word lines and insulating layers stacked on the lower string;
semiconductor pillars penetrating the stack; and
data storing layers between the plurality of word lines and the semiconductor pillars, wherein the plurality of word lines, the data storing layers and the semiconductor pillars form a plurality of memory cell transistors.

20. The device of claim 18, wherein each of the lower transistors comprises a lower gate electrode, wherein the lower gate electrodes are spaced apart from each other on the semiconductor substrate, and wherein the device further comprises a plurality of impurity regions in the semiconductor substrate between respective pairs of the lower gate electrodes.

* * * * *